US012772528B2

(12) United States Patent
Byeon et al.

(10) Patent No.: US 12,772,528 B2
(45) Date of Patent: Oct. 20, 2026

(54) INTEGRATED CIRCUIT DEVICE INCLUDING A FIELD-EFFECT TRANSISTOR HAVING A SEMICONDUCTOR EPITAXIAL STRUCTURE AND METHOD OF MANUFACTURING THE SAME

(71) Applicant: SAMSUNG ELECTRONICS CO., LTD., Suwon-si (KR)

(72) Inventors: Hyohoon Byeon, Suwon-si (KR); Seokhoon Kim, Suwon-si (KR); Unki Kim, Suwon-si (KR); Pankwi Park, Suwon-si (KR); Sungkeun Lim, Suwon-si (KR); Yuyeong Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 222 days.

(21) Appl. No.: 18/513,759

(22) Filed: Nov. 20, 2023

(65) Prior Publication Data

US 2024/0243188 A1 Jul. 18, 2024

(30) Foreign Application Priority Data

Jan. 13, 2023 (KR) ........................ 10-2023-0005636

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC ............... H10D 64/017; H10D 30/014; H10D 30/6735; H10D 30/501–509;
(Continued)

(56) References Cited

U.S. PATENT DOCUMENTS 10,872,818 B2 12/2020 Chiang et al.
11,276,643 B2 3/2022 Huang et al.
(Continued)

FOREIGN PATENT DOCUMENTS

CN 115312515 A 11/2022
KR 10-2022-0104617 7/2022

OTHER PUBLICATIONS

S. Samavedam, "Future logic scaling: Towards atomic channels and deconstructed chips", 2020 IEEE International Electron Devices Meeting (IEDM), pp. IEDM20-1-IEDM20-10.
(Continued)

*Primary Examiner* — Chad M Dicke
*Assistant Examiner* — Jeremy Daniel Watts
(74) *Attorney, Agent, or Firm* — Morgan, Lewis & Bockius LLP

(57) ABSTRACT

An integrated circuit device includes: a rear wiring structure; an insulating substrate including fin structures disposed on the rear wiring structure and extending in a first horizontal direction; a device isolation layer disposed between the fin structures; a lower insulating layer covering the fin structures; gate structures extending in a second horizontal direction crossing the first horizontal direction; a plurality of nanosheet stacks disposed on the lower insulating layer; a first source/drain region disposed on the insulating substrate and including a body portion and a vertical extension portion, wherein the body portion is disposed between the plurality of nanosheet stacks, and the vertical extension portion passes through the lower insulating layer and
(Continued)

through some of the fin structures; a semiconductor epitaxial structure at least partially surrounding the vertical extension portion of the first source/drain region; and a lower contact connecting the semiconductor epitaxial structure with the rear wiring structure.

17 Claims, 32 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ..... *H10D 30/6735* (2025.01); *H10D 30/6757* (2025.01); *H10D 62/121* (2025.01); *H10D 62/151* (2025.01); *H10D 84/0133* (2025.01); *H10D 84/0149* (2025.01); *H10D 84/038* (2025.01); *H10D 84/83* (2025.01)

(58) Field of Classification Search

CPC .......... H10D 84/832–833; H10D 84/851–852; H10D 64/251–259

See application file for complete search history.

(56) References Cited

U.S. PATENT DOCUMENTS

| | | | | |
|---|---|---|---|---|
| 11,393,819 | B2 | 7/2022 | Li et al. | |
| 11,417,767 | B2 | 8/2022 | Chang et al. | |
| 11,450,559 | B2 | 9/2022 | Chang et al. | |
| 2021/0336020 | A1 | 10/2021 | Yu et al. | |
| 2021/0399099 | A1* | 12/2021 | Chu | H10D 30/6729 |
| 2022/0037507 | A1 | 2/2022 | More et al. | |
| 2022/0230947 | A1* | 7/2022 | Park | H10W 20/427 |
| 2022/0367727 | A1* | 11/2022 | Chang | H10D 30/6713 |
| 2022/0392894 | A1 | 12/2022 | More et al. | |
| 2023/0013764 | A1* | 1/2023 | Chou | H10D 1/692 |

OTHER PUBLICATIONS

D. Prasad, “Buried power rails and back-side power grids: Arm® CPU power delivery network design beyond 5nm”, © 2019 IEEE, pp. IEDM19-446-IEDM19-449.

J. Zhang, “Full bottom dielectric isolation to enable stacked nanosheet transistor for low power and high performance applications”, © 2019 IEEE, pp. IEDM19-250-IEDM19-253.

EESR issued in Corresponding Application No. EP Patent Application No. 23214900.5 on Sep. 6, 2024.

First Office Action issued May 12, 2026 in corresponding Taiwanese Patent Application No. 112150194.

Notice of Allowance issued Sep. 10, 2026 in corresponding Taiwanese Patent Application No. 112150194.

* cited by examiner

INTEGRATED CIRCUIT DEVICE INCLUDING A FIELD-EFFECT TRANSISTOR HAVING A SEMICONDUCTOR EPITAXIAL STRUCTURE AND METHOD OF MANUFACTURING THE SAME

CROSS-REFERENCE TO RELATED APPLICATION

This application claims priority under 35 U.S.C. § 119 to Korean Patent Application No. 10-2023-0005636, filed on Jan. 13, 2023, in the Korean Intellectual Property Office, the disclosure of which is incorporated by reference herein in its entirety.

TECHNICAL FIELD

The present inventive concept relates to an integrated circuit device, and more particularly, to an integrated circuit device including a field-effect transistor.

DISCUSSION THE RELATED ART

With the development of electronics technology, the down-scaling of an integrated circuit device has been conducted at an increased rate. Since semiconductor devices with high operating speed and accuracy in operation are in demand, various studies are being conducted to optimize the structure of transistors included in semiconductor devices.

SUMMARY

According to an embodiment of the present inventive concept, an integrated circuit device includes: a rear wiring structure; an insulating substrate disposed on the rear wiring structure and including a plurality of fin structures extending in a first horizontal direction; a device isolation layer disposed between the plurality of fin structures; a lower insulating layer covering top surfaces of the plurality of fin structures; a plurality of gate structures extending in a second horizontal direction crossing the first horizontal direction on the insulating substrate; a plurality of nanosheet stacks disposed on the lower insulating layer and at least partially surrounded by the plurality of gate structures; a first source/drain region disposed on the insulating substrate and including a body portion and a vertical extension portion, wherein the body portion is disposed between the plurality of nanosheet stacks, and the vertical extension portion passes through the lower insulating layer and at least partially passes through a corresponding one of the plurality of fin structures; a semiconductor epitaxial structure at least partially surrounding the vertical extension portion of the first source/drain region; and a lower contact connecting the semiconductor epitaxial structure with the rear wiring structure.

According to an embodiment of the present inventive concept, an integrated circuit device includes: an insulating substrate including a plurality of fin structures extending in a first horizontal direction, a lower insulating layer covering top surfaces of the plurality of fin structures; a plurality of gate structures extending in a second horizontal direction crossing the first horizontal direction on the insulating substrate; and a first source/drain region and a second source/drain region spaced apart from each other in the first horizontal direction on the insulating substrate with a first gate structure of the plurality of gate structures disposed therebetween; and a semiconductor epitaxial structure disposed below a bottom surface of the lower insulating layer, wherein the first source/drain region penetrates the lower insulating layer and a portion of the semiconductor epitaxial structure, and contacts the semiconductor epitaxial structure.

According to an embodiment of the present inventive concept, an integrated circuit device includes: a rear wiring structure extending in a first horizontal direction; an insulating substrate disposed on the rear wiring structure and including a plurality of fin structures extending in the first horizontal direction; a lower insulating layer covering the plurality of fin structures; a plurality of gate structures extending in a second horizontal direction crossing the first horizontal direction on the insulating substrate; a plurality of nanosheet stacks disposed on the lower insulating layer and at least partially surrounded by the plurality of gate structures; a first source/drain region disposed on the insulating substrate and including a body portion and a vertical extension portion, wherein the body portion is disposed between the plurality of nanosheet stacks, and the vertical extension portion passes through the lower insulating layer and at least partially passes through a corresponding one of the plurality of fin structures; a second source/drain region spaced apart from the first source/drain region in the first horizontal direction with a first gate structure of the plurality of gate structures disposed therebetween; a semiconductor epitaxial structure at least partially surrounding the vertical extension portion of the first source/drain region; and a lower contact connecting the semiconductor epitaxial structure with the rear wiring structure.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
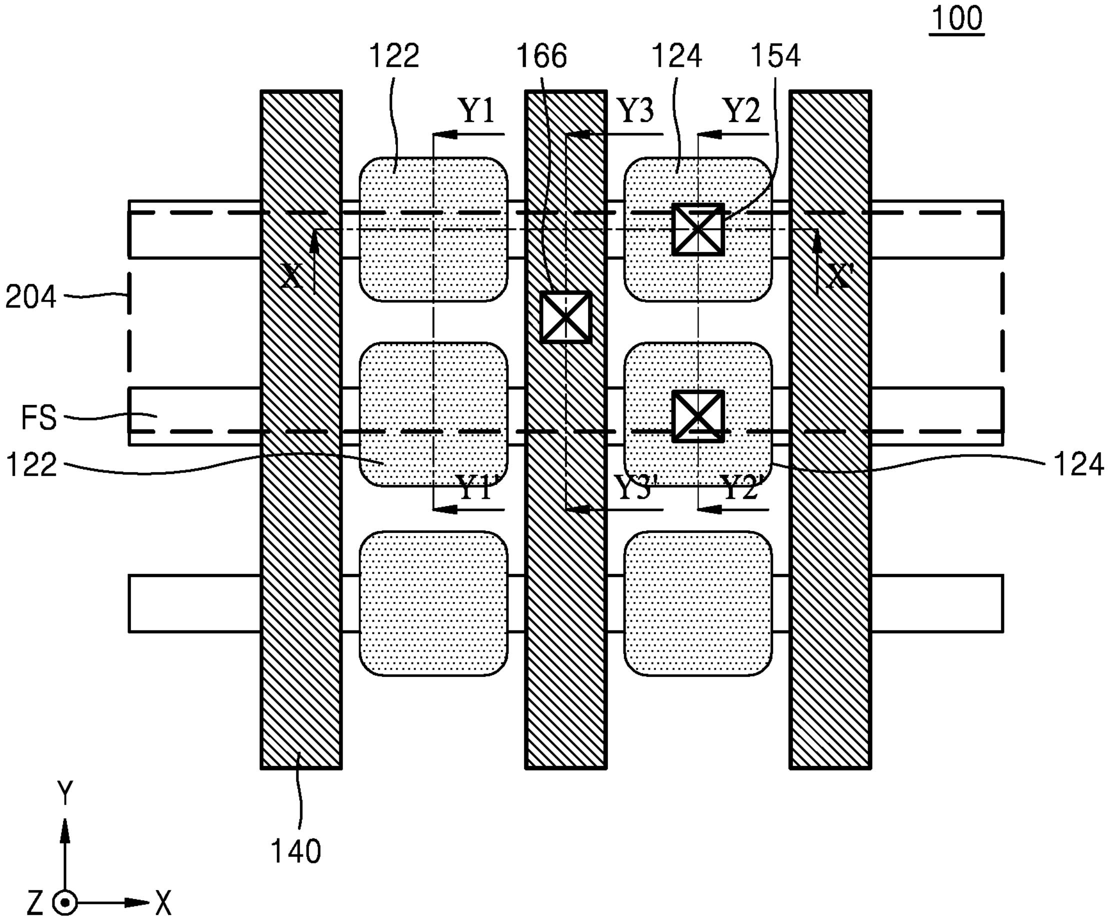
FIG. 1 is a plan layout diagram of some elements of an integrated circuit device according to an embodiment of the present inventive concept.

Hereinafter, embodiments of the present inventive concept will be described in detail with reference to the accompanying drawings. The same reference numerals are used for the same components in the drawings and specification, and redundant descriptions thereof will be omitted or briefly discussed.

Figure 2A:
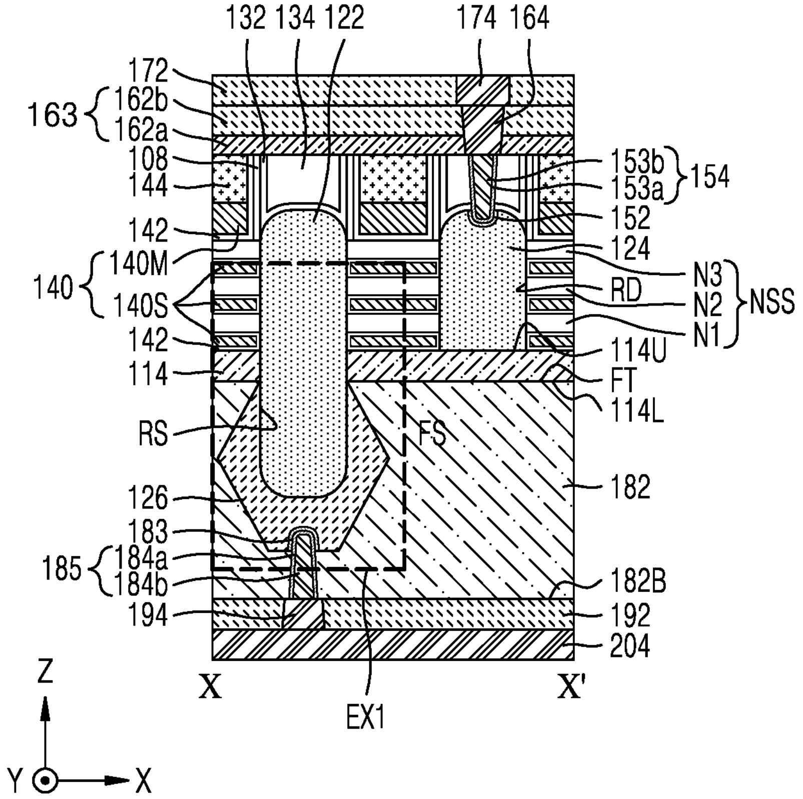
FIG. 2A is a cross-sectional view taken along line X-X' of FIG. 1.
Figure 2B:
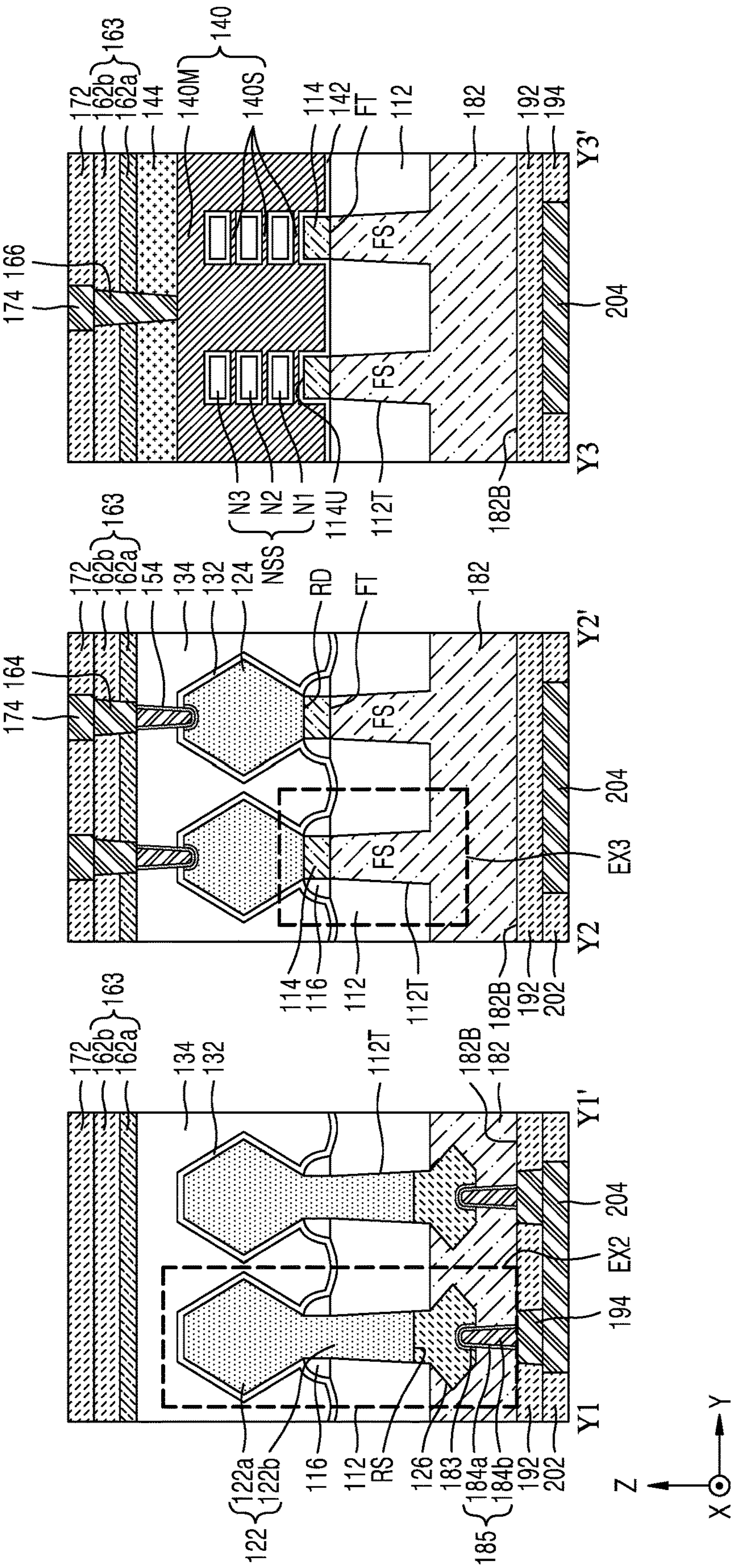
FIG. 2B illustrates cross-sectional views taken along lines Y1-Y1', Y2-Y2', and Y3-Y3' of FIG. 1.
Figure 3A:
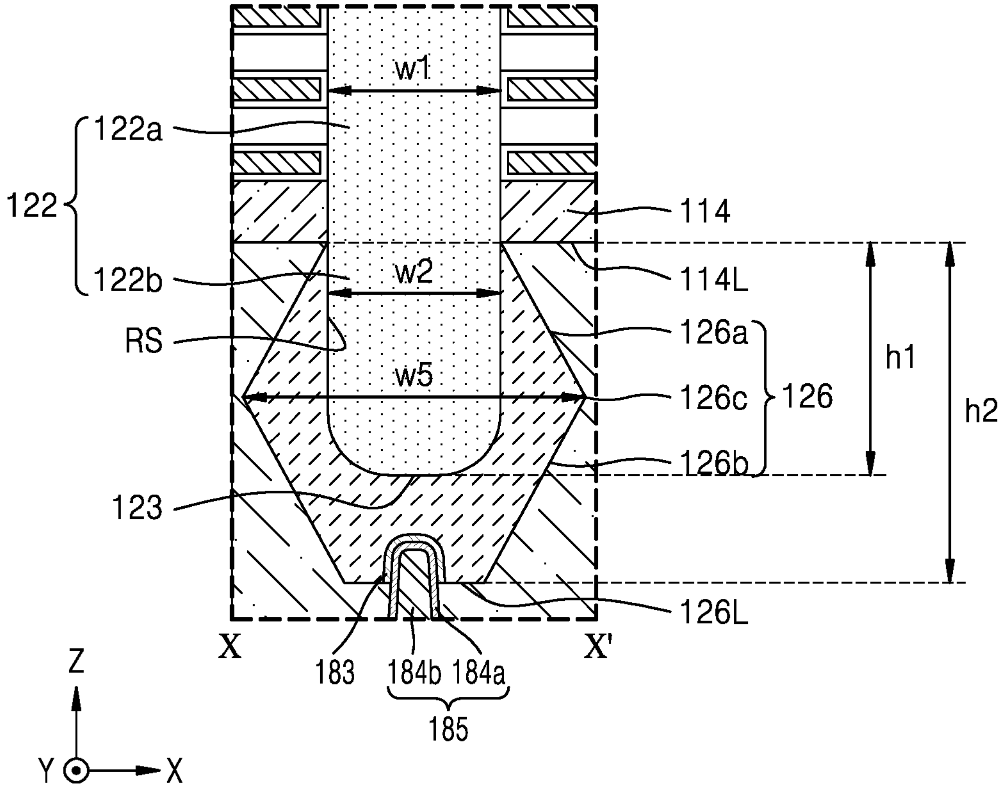
FIG. 3A is an enlarged view of a portion indicated by "EX1" of FIG. 2A.
Figure 3B:
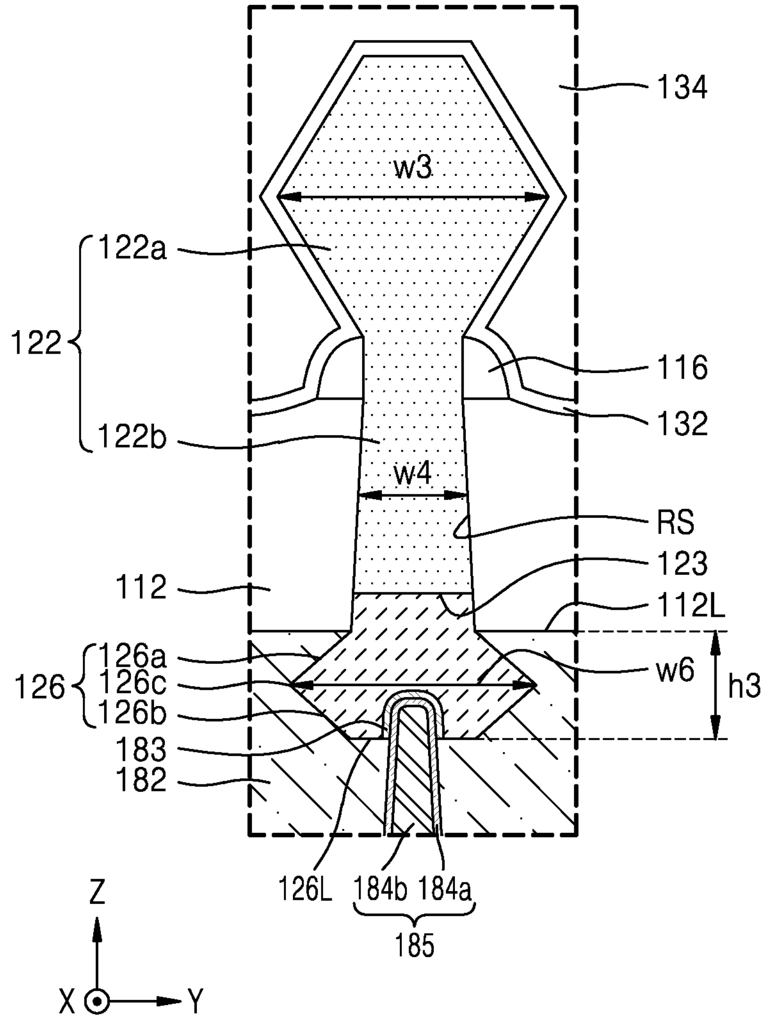
FIG. 3B is an enlarged view of a portion indicated by "EX2" of FIG. 2B.
Figure 3C:
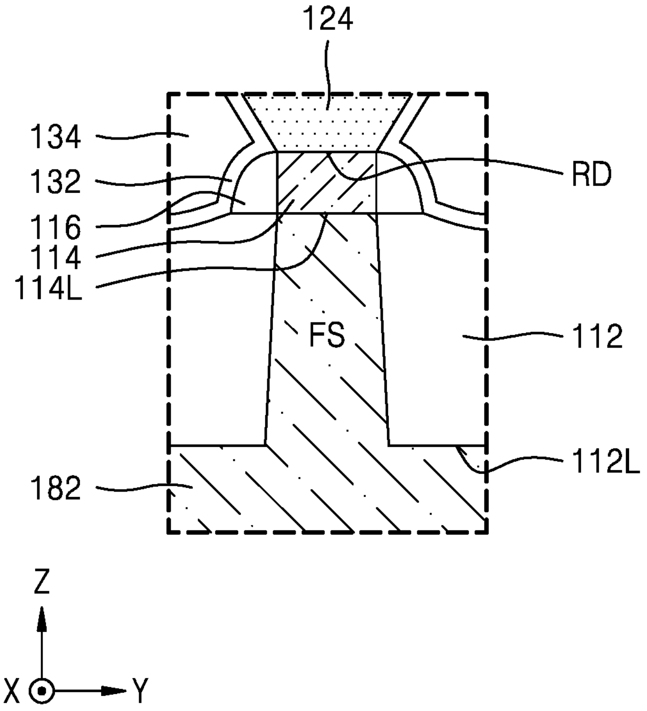
FIG. 3C is an enlarged view of a portion indicated by "EX3" of FIG. 2B.

FIG. 1 is a plan layout diagram of some elements of an integrated circuit device 100 according to an embodiment of the present inventive concept. FIG. 2A is a cross-sectional view taken along line X-X' of FIG. 1, and FIG. 2B illustrates cross-sectional views taken along lines Y1-Y1', Y2-Y2', and Y3-Y3' of FIG. 1. FIG. 3A is an enlarged view of a portion indicated by "EX1" of FIG. 2A. FIG. 3B is an enlarged view of a portion indicated by "EX2" of FIG. 2B. FIG. 3C is an enlarged view of a portion indicated by "EX3" of FIG. 2B.

In some embodiments described below with reference to FIGS. 1, 2A, 2B, and 3A to 3C, the integrated circuit device 100 may constitute a logic cell including a multi-bridge channel field-effect transistor (FET) (MBCFET) device. However, the present inventive concept is not limited thereto, and the integrated circuit device 100 may include a two-dimensional material-based FET device, such as a planar FET device, a gate-all-around type FET device, a finFET device, and a $MoS_2$ semiconductor gate electrode.

Referring to FIGS. 1, 2A, 2B, and 3A to 3C, the integrated circuit device 100 may include an insulating substrate 182 including a plurality of fin structures FS defined by device isolation trenches 112T. According to some embodiments of the present inventive concept, the plurality of fin structures FS may extend in parallel to each other in the first horizontal direction (e.g., an X direction). For example, the insulating substrate 182 may be made of silicon oxide, silicon nitride, or a combination thereof.

According to some embodiments of the present inventive concept, a device isolation layer 112 filling the device isolation trench 112T may be disposed between the plurality of fin structures FS. According to some embodiments of the present inventive concept, the device isolation layer 112 may cover the bottom surface of the device isolation trench 112T and sidewalls of the plurality of fin structures FS. According to some embodiments of the present inventive concept, the top surfaces FT of the plurality of fin structures FS may be covered by lower insulating layers 114.

According to some embodiments of the present inventive concept, the device isolation layer 112 may be formed of silicon oxide. According to some embodiments of the present inventive concept, a lower insulating layer 114 may be made of silicon oxide, silicon nitride, or a combination thereof. According to some embodiments of the present inventive concept, the lower insulating layer 114 may be made of a material having a dielectric constant of about 3.5 or more.

According to some embodiments of the present inventive concept, a plurality of gate structures 140 may be disposed on the plurality of fin structures FS. According to some embodiments of the present inventive concept, the plurality of gate structures 140 may extend in parallel to each other in the second horizontal direction (e.g., a Y direction).

According to some embodiments, each of a plurality of nanosheet stacks NSS may be placed on a top surface 114U of the lower insulating layer 114 in regions where the plurality of fin structures FS intersect with the plurality of gate structures 140. According to some embodiments of the present inventive concept, each of the plurality of nanosheet stacks NSS may face the top surface 114U of the lower insulating layer 114 at a position spaced apart from the lower insulating layer 114 in the vertical direction (e.g., a Z direction). In the present specification, the term "nanosheet" may refer to a conductive structure having a cross-section substantially perpendicular to a direction in which a current flows. For example, the nanosheet may be understood as a concept including nanowires. According to some embodiments of the present inventive concept, on the insulating substrate 182, a plurality of nanosheet transistors may be formed in regions where the plurality of fin structures FS intersect with the plurality of gate structures 140.

According to some embodiments of the present inventive concept, each of the plurality of nanosheet stacks NSS may include a first nanosheet N1, a second nanosheet N2, and a third nanosheet N3 overlapping on the lower insulating layer 114 in a vertical direction (e.g., the Z direction). According to some embodiments of the present inventive concept, the first nanosheet N1, the second nanosheet N2, and the third nanosheet N3 may have different distances in the vertical direction (e.g., the Z direction) from the upper surface 114U of the lower insulating layer 114. According to some embodiments of the present inventive concept, the plurality of gate structures 140 may wrap around the first nanosheet N1, the second nanosheet N2, and the third nanosheet N3 included in each of the nanosheet stacks NSS overlapping in the vertical direction (e.g., the Z direction), respectively. According to some embodiments of the present inventive concept, the plurality of gate structures 140 may at least partially surround the top surface 114U of the lower insulating layer 114 and sidewalls of the lower insulating layer 114.

Although FIGS. 2A and 2B illustrate a case in which the planar shape of each of the nanosheet stacks NSS is approximately rectangular, the embodiments of the present inventive concept are not limited thereto. The nanosheet stacks NSS may have various planar shapes according to the planar shape of each of the fin structures FS and the gate structures 140. In the present embodiment, each of a plurality of nanosheet stacks NSS and each of a plurality of gate structures 140 are disposed on a fin structure FS, and each of a plurality of nanosheet stacks NSS is arranged in a line in a first horizontal direction (e.g., the X direction) on a fin structure FS. However, the number of nanosheet stacks NSS and the number of gate structures 140 placed on one fin structure FS are not particularly limited.

According to some embodiments of the present inventive concept, each of the first nanosheet N1, the second nanosheet N2, and the third nanosheet N3 included in each of the nanosheet stacks NSS may function as a channel region. According to some embodiments of the present inventive concept, each of the first nanosheet N1, the second nanosheet N2, and the third nanosheet N3 may have a thickness selected from a range of about 4 nm to about 6 nm, but the present inventive concept is not limited thereto. Here, the thickness of each of the first nanosheet N1, the second nanosheet N2, and the third nanosheet N3 is a magnitude in the vertical direction (e.g., the Z direction). According to some embodiments of the present inventive concept, each of the first nanosheet N1, the second nanosheet N2, and the third nanosheet N3 may have substantially the same thickness as each other in the vertical direction (e.g., the Z direction). According to some embodiments of the present inventive concept, at least one of the first nanosheet N1, the second nanosheet N2, and the third nanosheet N3 may have different thicknesses in the vertical direction (e.g., the Z direction) from each other. According to some embodiments of the present inventive concept, each of the first nanosheet N1, the second nanosheet N2, and the third nanosheet N3 included in the nanosheet stacks NSS may be formed of a Si layer, a SiGe layer, or a combination thereof.

As illustrated in FIGS. 2A and 2B, the first nanosheet N1, the second nanosheet N2, and the third nanosheet N3 included in one nanosheet stack NSS may have the same or similar sizes in the first horizontal direction (e.g., the X direction). In some embodiments of the present inventive concept, unlike illustrated in FIGS. 2A and 2B, at least some of the first nanosheet N1, the second nanosheet N2, and the third nanosheet N3 included in one nanosheet stack NSS may have different sizes in the first horizontal direction (e.g., the X direction) from each other. In this embodiment of the present inventive concept, a case where each of the plurality of nanosheet stacks NSS is formed of three nanosheets has been illustrated, but the present inventive concept is not limited to those illustrated. For example, the nanosheet stack NSS may include at least one nanosheet, and the number of nanosheets constituting the nanosheet stack NSS is not particularly limited.

As illustrated in FIGS. 2A and 2B, the plurality of gate structures 140 may include a main gate portion 140M and a plurality of sub-gate portions 140S, respectively. According to some embodiments of the present inventive concept, the main gate portion 140M may extend long in the second horizontal direction (e.g., the Y direction) while covering the top surfaces of the nanosheet stacks NSS. According to some embodiments of the present inventive concept, the plurality of sub-gate portions 140S may be integrally connected to the main gate portion 140M, and may be disposed between the first nanosheet N1 and the second nanosheet N2, between the second nanosheet N2 and the third nanosheet N3, and between the first nanosheet N1 and the lower insulating layer 114. According to some embodiments of the present inventive concept, in the vertical direction (e.g., the Z direction), the thickness of each of the plurality of sub-gate portions 140S may be less than the thickness of the main gate portion 140M.

According to some embodiments of the present inventive concept, each of the plurality of gate structures 140 may be made of a metal, a metal nitride, a metal carbide, or a combination thereof. The metal may include, for example, Ti, W, Ru, Nb, Mo, Hf, Ni, Co, Pt, Yb, Tb, Dy, Er, Pd, and combinations thereof. For example, the metal nitride may be selected from TiN and TaN. For example, the metal carbide may be TiAlC.

According to some embodiments of the present inventive concept, a gate dielectric layer 142 may be placed between a plurality of nanosheets N1, N2, and N3 constituting the nanosheet stack NSS and the gate structure 140. According to some embodiments of the present inventive concept, the gate dielectric layer 142 may include portions covering the surface of each of the plurality of nanosheets N1, N2, and N3, and portions covering the sidewalls of the main gate portion 140M. For example, the main gate portion 140M may be disposed on the gate dielectric layer 142.

According to some embodiments of the present inventive concept, the gate dielectric layer 142 may have a stacked structure of an interface layer and a high dielectric layer. The interface layer may include a low dielectric material layer with a dielectric constant of about 9 or less, for example, a silicon oxide layer, a silicon oxynitride layer, or a combination of it. According to some embodiments of the present inventive concept, the interface layer may be omitted. According to some embodiments of the present inventive concept, the high dielectric layer may be made of a material having a dielectric constant higher than the silicon oxide layer. For example, the high dielectric layer may have a dielectric constant of about 10 to about 25. The high dielectric layer may be made of, for example, hafnium oxide, but the present inventive concept is not limited thereto.

According to some embodiments of the present inventive concept, a first recess RS and a second recess RD may be formed on each of the plurality of fin structures FS. According to some embodiments of the present inventive concept, the second recess RD may be spaced apart from the first recess RS with the gate structure 140 adjacent to the first recess RS therebetween.

According to some embodiments of the present inventive concept, a plurality of first source/drain regions 122 may be disposed in a plurality of first recesses RS, respectively, and a plurality of second source/drain regions 124 may be disposed in a plurality of second recesses RD, respectively. In some embodiments of the present inventive concept, the first source/drain region 122 may be a source region, and the second source/drain region 124 may be a drain region.

According to some embodiments of the present inventive concept, the first source/drain region 122 and the second source/drain region 124 may be formed of a semiconductor material. For example, the semiconductor material may include semiconductors such as Si or Ge, or compound semiconductors such as SiGe, SiC, GaAs, InAs, InGaAs, or InP. In some embodiments of the present inventive concept, the first source/drain regions 122 and the second source/drain regions 124 may each consist of a semiconductor layer doped with a p-type dopant. For example, the p-type dopant may be selected from boron (B) and gallium (Ga). In some embodiments of the present inventive concept, the first source/drain regions 122 and the second source/drain regions 124 may each consist of a semiconductor layer doped with an n-type dopant. For example, the n-type dopant may be selected from phosphorus (P), arsenic (As), and antimony (Sb).

According to some embodiments of the present inventive concept, the plurality of first source/drain regions 122 and the plurality of second source/drain regions 124 may be spaced apart from each other in the first horizontal direction (e.g., the X direction) with one gate structure 140 selected from the plurality of gate structures 140 therebetween, and may be arranged in the second horizontal direction (e.g., the Y direction).

In some embodiments of the present inventive concept, unlike illustrated in FIG. 1, the plurality of first source/drain regions 122 and the plurality of second source/drain regions 124 may be arranged to cross each other in the second horizontal direction (e.g., the Y direction).

According to some embodiments of the present inventive concept, the plurality of first source/drain regions 122 may each include a body portion 122*a* disposed between the plurality of nanosheet stacks NSS and a vertical extension portion 122*b* passing through the lower insulating layer 114 and at least partially penetrating the fin structure FS. According to some embodiments of the present inventive concept, the length of the lower insulating layer 114 may be limited in the first horizontal direction (e.g., the X direction) by the first source/drain region 122.

According to some embodiments of the present inventive concept, the body portion 122*a* may have surfaces facing the first nanosheet N1, the second nanosheet N2, and the third nanosheet N3 included in the adjacent nanosheet stack NSS. According to some embodiments of the present inventive concept, the body portion 122*a* may be in contact with the first nanosheet N1, the second nanosheet N2, and the third nanosheet N3 that are included in the adjacent nanosheet stack NSS.

According to some embodiments of the present inventive concept, the vertical extension portion 122*b* extends from the body portion 122*a* in the vertical direction (e.g., the Z direction) and may protrude from the bottom surface 114L of the lower insulating layer 114. According to some embodiments of the present inventive concept, the sidewall of the vertical extension portion 122*b* may include a portion facing the lower insulating layer 114 in the first horizontal direction (e.g., the X direction). According to some embodiments of the present inventive concept, the sidewall of the vertical extension portion 122*b* may include a portion facing the device isolation layer 112 in the second horizontal direction (e.g., the Y direction). According to some embodiment of the present inventive concept, the vertical extension portion 122*b* may penetrate the device isolation layer 112.

According to some embodiments of the present inventive concept, the bottom surface 123 of the vertical extension portion 122*b* may have a vertical level lower than the bottom surface 114L of the lower insulating layer 114. For example, the term "vertical level" used in this specification may be a distance in the vertical direction (Z direction or −Z direction) from the bottom surface 114L of the lower insulating layer 114. According to some embodiments of the present inventive concept, the vertical extension portion 122*b* may protrude from the bottom surface 114L of the lower insulating layer 114 by a first length h1.

According to some embodiments of the present inventive concept, the body portion 122*a* may have a first width w1 in the first horizontal direction (e.g., the X direction), and the vertical extension portion 122*b* may have a second width w2 in the first horizontal direction (e.g., the X direction). According to some embodiments of the present inventive concept, the first width w1 of the body portion 122*a* may be substantially the same as the second width w2 of the vertical extension portion 122*b*. In some embodiments of the present inventive concept, the first width w1 of the body portion 122*a* may be less than the second width w2 of the vertical extension portion 122*b*. In some embodiments of the present inventive concept, the first width w1 of the body portion 122*a* may be greater than the second width w2 of the vertical extension portion 122*b*.

According to some embodiments of the present inventive concept, the body portion 122*a* may have a third width w3 that is a width in the second horizontal direction (e.g., the Y direction), and the vertical extension portion 122*b* may have a fourth width w4 in the second horizontal direction (e.g., the Y direction). According to some embodiments of the present inventive concept, the third width w3 of the body portion 122*a* may be greater than the fourth width w4 of the vertical extension portion 122*b*.

According to some embodiments of the present inventive concept, the plurality of second source/drain regions 124 may be disposed between the plurality of nanosheet stacks NSS on the lower insulating layer 114, respectively. For example, the second source/drain regions 124 may penetrate the plurality of nanosheet stacks NSS. According to some embodiments of the present inventive concept, the plurality of second source/drain regions 124 may be in contact with the top surfaces 114U of the lower insulating layers 114, respectively. According to some embodiments of the present inventive concept, the plurality of second source/drain regions 124 may each have surfaces facing the first nanosheet N1, the second nanosheet N2, and the third nanosheet N3 that are included in the adjacent nanosheet stack NSS. For example, the plurality of second source/drain regions 124 may be in contact with the first nanosheet N1, the second nanosheet N2, and the third nanosheet N3 included in the adjacent nanosheet stack NSS, respectively.

According to some embodiments of the present inventive concept, the plurality of second source/drain regions 124 may be spaced apart from the fin structures FS with the lower insulating layers 114 therebetween, respectively. The lower insulating layer 114 according to some embodiments of the present inventive concept is placed between each of the plurality of fin structures FS and each of the plurality of second source/drain regions 124, preventing a short circuit between a lower contact structure 185, which connects a rear wiring structure 204 with the first source/drain region 122, and the second source/drain region 124 due to a process variation.

According to some embodiments of the present inventive concept, a semiconductor epitaxial structure 126 surrounding the vertical extension portion 122*b* of the first source/drain region 122 may be disposed on the bottom surface 114L of the lower insulating layer 114. According to some embodiments of the present inventive concept, the semiconductor epitaxial structure 126 may contact the vertical extension portion 122*b* of the first source/drain region 122 and may be electrically connected to the first source/drain region 122. According to some embodiments of the present inventive concept, the semiconductor epitaxial structure 126 may have a structure partially penetrated in the vertical direction (e.g., the Z direction) by the vertical extension portion 122*b* of the first source/drain region 122.

For example, the semiconductor epitaxial structure 126 may be formed by epitaxially growing semiconductor materials in a part of the vertical extension portion 122*b* protruding on the bottom surface 114L of the lower insulating layer 114. According to some embodiments of the present inventive concept, the semiconductor materials may include group IV semiconductors such as Si or Ge, group IV-IV compound semiconductors such as SiGe or SiC, or group III-V compound semiconductors such as GaAs, InAs, or InP. In some embodiments of the present inventive concept, the semiconductor epitaxial structure 126 may be formed of a p-type semiconductor layer doped with B or Ga. In some embodiments of the present inventive concept, the semiconductor epitaxial structure 126 may be formed of an n-type semiconductor layer doped with P, As, or Sb.

According to some embodiments of the present inventive concept, the semiconductor epitaxial structure 126 may include a first portion 126*a* with a positive profile that a width of the semiconductor epitaxial structure 126 in the horizontal direction increases away from the bottom surface 114L of the lower insulating layer in the Z direction. The semiconductor epitaxial structure 126 may also include a second portion 126*b* extending from the first portion, and the second portion 126*b* has a negative profile that the width of the semiconductor epitaxial structure 126 in the horizontal direction decreases away from the bottom surface 114L of the lower insulating layer in the Z direction. For example, the sidewall of the semiconductor epitaxial structure 126 may have the positive profile in the first portion 126*a* and the negative profile in the second portion 126*b*.

The profile of the semiconductor epitaxial structure 126 is due to the difference in the growth rate of the epitaxial layer according to the crystal plane of the vertical extension portion 122*b* of the first source/drain region 122. For example, the epitaxial layer may grow at a faster rate in the <110> crystal plane than in the <100> crystal plane of the vertical extension portion 122*b*, and at a slower rate in each of the <311> crystal plane and <111> crystal plane than in the <100> crystal plane thereof. The semiconductor epitaxial structure 126 according to some embodiments of the present inventive concept grows a semiconductor material from the vertical extension portion 122*b*, which is protruding from the bottom surface 114L of the lower insulating layer 114, by using a growth rate difference of the epitaxial layers according to the crystal planes and may thus have a profile having an expanded width in the horizontal direction (e.g., the X direction and/or Y direction).

According to some embodiments of the present inventive concept, the semiconductor epitaxial structure 126 may have a third portion 126*c* having a maximum horizontal width between the first portion 126*a* and the second portion 126*b*. According to some embodiments of the present inventive concept, the horizontal width of the third portion 126*c* of the semiconductor epitaxial structure 126 may be greater than the horizontal width of the vertical extension portion 122*b* of the first source/drain region 122. For example, the fifth width w5, which is the width of the third portion 126*c* of the semiconductor epitaxial structure 126, in the first horizontal direction (e.g., the X direction) may be greater than the second width w2, which is the width of the vertical extension portion 122*b* of the first source/drain region 122, in the first horizontal direction (e.g., the X direction). For example, the sixth width w6, which is the width of the third portion 126*c* of the semiconductor epitaxial structure 126, in the second horizontal direction (e.g., the Y direction) may be greater than the fourth width w4, which is the width of the vertical extension portion 122*b* of the first source/drain region 122, in the second horizontal direction (e.g., the Y direction).

The first portion 126*a*, the second portion 126*b*, and the third portion 126*c* shown in FIGS. 2A and 3A, refer to different portions from the first portion 126*a*, the second portion 126*b*, and the third portion 126*c* shown in FIGS. 2B and 3B. For example, the semiconductor epitaxial structure 126 may include the first portion 126*a* with the positive profile, the second portion 126*b* with the negative profile, and the third portion 126*c* between the first portion 126*a* and the second portion 126*b*, in cross-sections (FIGS. 2A and 3A) in the first horizontal direction (e.g., the X direction). For example, the semiconductor epitaxial structure 126 may additionally include the first portion 126*a* with the positive profile, the second portion 126*b* with the negative profile, and the third portion 126*c* between the first portion 126*a* and the second portion 126*b*, in cross-sections (FIGS. 2B and 3B) in the second horizontal direction (e.g., the X direction).

According to some embodiments of the present inventive concept, the semiconductor epitaxial structure 126 may have a bottom surface 126L opposite to a portion of the semiconductor epitaxial structure 126 that is in contact with the lower insulating layer 114. According to some embodiments of the present inventive concept, the bottom surface 126L of the semiconductor epitaxial structure 126 may be disposed at a vertical level lower than the bottom surface 123 of the first source/drain region 122. According to some embodiments of the present inventive concept, the bottom surface 126L of the semiconductor epitaxial structure 126 may be disposed at a vertical level lower than the bottom surface 114L of the lower insulating layer 114 by a second height h2. According to some embodiments of the present inventive concept, the bottom surface 126L of the semiconductor epitaxial structure 126 may be disposed at a vertical level lower than the bottom surface 112L of the device isolation layer 112 by a third height h3. According to some embodiments of the present inventive concept, the second height h2 may be greater than the third height h3.

According to some embodiments of the present inventive concept, the insulating substrate 182 may have a rear surface 182B opposite to a fin top surface FT. According to some embodiments of the present inventive concept, a lower contact structure 185 penetrates a portion of the insulation substrate 182 in the vertical direction (e.g., the Z direction) and contacts the semiconductor epitaxial structure 126.

According to some embodiments of the present inventive concept, a lower silicide layer 183 may be formed between the lower contact structure 185 and the semiconductor epitaxial structure 126.

According to some embodiments of the present inventive concept, the lower contact structure 185 may include a conductive barrier 184*a* and a contact plug 184*b*. The conductive barrier 184*a* that at least partially surrounds the top surface and side surfaces of the contact plug 184*b*, and may be disposed on the top surface and side surfaces of the contact plug 184*b*. For example, the conductive barrier 184*a* may be in contact with the top surface and side surfaces of the contact plug 184*b*. According to some embodiments of the present inventive concept, the conductive barrier 184*a* may be placed between the lower silicide layer 183 and the contact plug 184*b*.

According to some embodiments of the present inventive concept, the contact plug 184*b* may be made of molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but the present inventive concept is not limited thereto. According to some embodiments of the present inventive concept, the conductive barrier 184*a* may be made of metal or metal nitride. For example, the conductive barrier 184*a* may be formed of Ti, Ta, W, TiN, TaN, WN, WCN, TiSiN, TaSiN, WSiN, or a combination thereof, but the present inventive concept is not limited thereto. According to some embodiments of the present inventive concept, the lower silicide layer 183 may include a metal formed of Ti, W, Ru, Nb, Mo, Hf, Ni, Co, Pt, Yb, Tb, Dy, Er, or Pd. For example, the lower silicide layer 183 may be made of titanium silicide, but the present inventive concept is not limited thereto.

In some embodiments of the present inventive concept, the lower contact structure 185 may be formed of a single structure including a semiconductor material. For example, the semiconductor material may include Si, Ge, or SiGe, and may include doped polysilicon. However, the present inventive concept is not limited to, and for example, the lower contact structure 185 may be a multilayer structure.

According to some embodiments of the present inventive concept, a first lower insulating layer 192 and a second lower insulating layer 202 may be sequentially stacked on the rear surface 182B of the insulating substrate 182.

According to some embodiments of the present inventive concept, the first lower insulating layer 192 and the second lower insulating layer 202 may be formed of a silicon oxide layer, a silicon nitride layer, a silicon carbide layer, a low dielectric layer, or a combination thereof, respectively. The low dielectric layer is fluorine-doped silicon oxide, organosilicate glass, carbon-doped oxide, porous silicon oxide, porous organosilicate glass, spin-on organic polymeric dielectric, spin-on silicon based polymeric dielectric, or a combination thereof, but the present inventive concept is not limited to the examples.

According to some embodiments of the present inventive concept, the rear wiring structure 204 may extend in the first horizontal direction (e.g., the X direction) and may be disposed to penetrate the second lower insulation layer 202. For example, the rear wiring structure 204 may include a power delivery network configured to apply power voltage and ground voltage to the nanosheet transistor. According to some embodiments of the present inventive concept, the rear wiring structure 204 may be formed of Co, W, Cu, Ru, Mn, Ti, Ta, TiN, TaN, or a combination thereof, but the present inventive concept is not limited thereto.

According to some embodiments of the present inventive concept, the rear wiring structure 204 may be connected to the lower contact structure 185 through a lower via contact 194 that is in contact with the lower contact structure 185. According to some embodiments of the present inventive concept, the lower via contact 194 may include of molybdenum (Mo) or tungsten (W), but the present inventive concept is not limited thereto.

According to some embodiments of the present inventive concept, the rear wiring structure 204 may be configured to be electrically connected to the first source/drain region 122 through the lower via contact 194, the lower contact structure 185, the lower silicide layer 183, and the semiconductor epitaxial structure 126. For example, the lower contact structure 185 and the lower via contact 194 may constitute a lower contact for electrically connecting the rear wiring structure 204 with the first source/drain region 122.

The semiconductor epitaxial structure 126 according to the embodiments of the present inventive concept may secure a contact margin of the lower contact structure 185 connected to the semiconductor epitaxial structure 126, while including a third portion 126*c* with an extended horizontal width. In addition, the semiconductor epitaxial structure 126 is placed in the insulation substrate 182. The lower contact structure 185 penetrates the insulation substrate 182 and is connected to the semiconductor epitaxial structure 126. When a substrate is made of semiconductor material, a separate insulation liner for electrical insulation between the lower contact structure 185 and the semiconductor substrate may be desirable, but the insulation liner for electrical insulation may be omitted from the integrated circuit device 100 according to some embodiments of the present inventive concept.

According to some embodiments of the present inventive concept, a gate dielectric layer 142 may be placed between the nanosheet stack NSS and the gate structure 140. According to some embodiments of the present inventive concept, both sidewalls of each of the plurality of sub-gate portions 140S included in the plurality of gate structures 140 may be spaced apart from the first and second source/drain regions 122 and 124 with the gate dielectric layer 142 therebetween. According to some embodiments of the present inventive concept, the gate dielectric layer 142 may be placed between the sub-gate portion 140S of the gate structure 140 and each of the first nanosheet N1, the second nanosheet N2, and the third nanosheet N3, and between the sub-gate portion 140S of the gate structure 140 and each of the first and second source/drain regions 122 and 124.

According to some embodiments of the present inventive concept, the gate dielectric layer 142 may have a stacked structure of an interface dielectric layer and a high dielectric layer. The interface dielectric layer may be formed of a low dielectric material layer having a dielectric constant of about 9 or less, for example, a silicon oxide layer, a silicon oxynitride layer, or a combination thereof. According to some embodiments of the present inventive concept, the interface dielectric layer may be omitted. The high dielectric layer may be made of a material having a higher dielectric constant than that of a silicon oxide layer. For example, the high dielectric layer may have a dielectric constant of about 10 to about 25. The high dielectric layer may be made of hafnium oxide, but the present inventive concept is not limited thereto.

According to some embodiments of the present inventive concept, a top surface of each of the gate dielectric layer 142 and the gate structure 140 may be covered with a capping insulating layer 144. According to some embodiments of the present inventive concept, the capping insulating layer 144 may be formed of a silicon nitride layer.

According to some embodiments of the present inventive concept, both sidewalls of each of the gate structure 140 and the capping insulating layer 144 may be covered with an outer insulating spacer 108. According to some embodiments of the present inventive concept, the outer insulating spacer 108 may cover sidewalls of a main gate portion 140M while on the top surface of each of the plurality of nanosheet stacks NSS. For example, the outer insulating spacer 108 may be spaced apart from the gate structure 140 with the gate dielectric layer 142 therebetween.

According to some embodiments of the present inventive concept, a recess-side insulating spacer 116, which covers a part of the sidewall of the vertical extension portion 122*b* of the plurality of first source/drain regions 122 and the sidewall of the lower insulating layer 114, may be disposed on the top surface of the device isolation layer 112. According to some embodiments of the present inventive concept, the recess-side insulating spacer 116 may be integrally connected to the outer insulating spacer 108.

According to some embodiments of the present inventive concept, the sidewall of the vertical extension portion 122*b* of the first source/drain region 122 may be covered by the recess-side insulating spacer 116 and the device isolation layer 112 in the second horizontal direction (e.g., the Y direction). For example, the vertical extension portion 122*b* of the first source/drain region 122 may extend in the vertical direction (e.g., the Z direction) in a space limited by the recess-side insulating spacer 116 and the device isolation layer 112.

According to some embodiments of the present inventive concept, each of the outer insulating spacer 108 and the recess-side insulating spacer 116 may be formed of silicon nitride, silicon oxide, SiCN, SiBN, SiON, SiOCN, SiBCN, SiOC, or a combination thereof. The terms "SiCN", "SiBN", "SiON", "SiOCN", "SiBCN", and "SiOC" used herein, refer to materials formed of elements included in each of the terms, and are not chemical formulae representing a stoichiometric relationship.

According to some embodiments of the present inventive concept, an upper silicide layer 152 may be formed on a top surface of each of the plurality of second source/drain regions 124. According to some embodiments of the present inventive concept, the upper silicide layer 152 may include a metal formed of W, Ru, Nb, Mo, Hf, Ni, Co, Pt, Yb, Tb, Dy, Er, or Pd. For example, the upper silicide layer 152 may be made of titanium silicide, but the present inventive concept is not limited thereto.

According to some embodiments of the present inventive concept, the plurality of first source/drain regions 122, the plurality of second source/drain regions 124, and the plurality of outer insulating spacers 108 may be covered with insulating liners 132 on the insulating substrate 182. According to some embodiments of the present inventive concept, an inter-gate insulating layer 134 may be disposed on the insulating liner 132. In some embodiments of the present inventive concept, the insulating liner 132 may be omitted. In this case, the inter-gate insulating layer 134 may be in contact with the plurality of first source/drain regions 122 and the plurality of second source/drain regions 124.

According to some embodiments of the present inventive concept, the insulating liners 132 may be formed of silicon nitride, SiCN, SiBN, SiON, SiOCN, SiBCN, or a combination thereof, but the present inventive concept is not limited thereto. According to some embodiments of the present inventive concept, the inter-gate insulating layer 134 may be formed of a silicon oxide layer, but present inventive concept is not limited thereto.

According to some embodiments of the present inventive concept, a source/drain contact structure 154 may be disposed on each of the plurality of second source/drain regions 124. According to some embodiments of the present inventive concept, the source/drain contact structure 154 may penetrate the inter-gate insulation layer 134 and the insulation liner 132 in the vertical direction (e.g., the Z direction) to contact the upper silicide layer 152. According to some embodiments of the present inventive concept, the plurality of second source/drain regions 124 may be configured to be electrically connected to the source/drain contact structures 154 through the upper silicide layers 152, respectively.

According to some embodiments of the present inventive concept, the source/drain contact structure 154 may include a conductive barrier 153*a* and a contact plug 153*b* sequentially stacked on the second source/drain region 124. According to some embodiments of the present inventive concept, the conductive barrier 153*a* at least partially surrounds the bottom and side surfaces of the contact plug 153*b* and is disposed on the bottom and side surfaces of the contact plug 153*b*. For example, the conductive barrier 153*a* may be in contact with the bottom and side surfaces of the contact plug 153*b*. According to some embodiments of the present inventive concept, the conductive barrier 153*a* may be placed between the upper silicide layer 152 and the contact plug 153*b*. According to some embodiments of the present inventive concept, the conductive barrier 153*a* may be made of metal or metal nitride. According to some embodiments of the present inventive concept, the conductive barrier 153*a* may be formed of Ti, Ta, W, TiN, TaN, WN, WCN, TiSiN, TaSiN, WSiN, or a combination thereof, but the present inventive concept is not limited thereto. The contact plug 153*b* may be made of, for example, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but the present inventive concept is not limited thereto.

According to some embodiments of the present inventive concept, the top surface of each of the source/drain contact structure 154, the capping insulating layer 144, and the inter-gate insulating layer 134 may be covered with a first upper insulating layer 163. According to some embodiments of the present inventive concept, the first upper insulating layer 163 may include an etching stop layer 162*a* and an interlayer insulating layer 162*b*, which are stacked sequentially on the source/drain contact structure 154, the capping insulating layer 144, and the inter-gate insulating layer 134.

According to some embodiments of the present inventive concept, the etching stop layer 162*a* may be formed of silicon carbide (SiC), SiN, nitrogen-doped silicon carbide (SiCN), SiOC, AlN, MON, AO, AOC, or a combination thereof. According to some embodiments of the present inventive concept, the interlayer insulating layer 162*b* may be formed of an oxide layer, a nitride layer, an ultra low-k (ULK) layer having an ultra low dielectric constant K of about 2.2 to about 2.4, or a combination thereof. For example, the interlayer insulating layer 162*b* may include a tetraethylorthosilicate (TEOS) layer, a high density plasma (HDP) oxide layer, a boro-phospho-silicate glass (BPSG) layer, a flowable chemical vapor deposition (FCVD) oxide layer, a SiON layer, a SiN layer, a SiOC layer, a SiCOH layer, or a combination thereof, but the present inventive concept is not limited thereto.

According to some embodiments of the present inventive concept, a source/drain via contact 164 may be disposed on the source/drain contact structure 154. The source/drain via contact 164 may penetrate the first upper insulating layer 163 to be in contact with the source/drain contact structure 154. According to some embodiments of the present inventive concept, the plurality of second source/drain regions 124 may be configured to be electrically connected to the source/drain via contact 164 through the upper silicide layer 152 and the source/drain contact structure 154, respectively. According to some embodiments of the present inventive concept, the bottom surface of the source/drain via contact 164 may be in contact with the top surface of the source/drain contact structure 154. According to some embodiments of the present inventive concept, the source/drain via contact 164 may be made of molybdenum (Mo) or tungsten (W) but is not limited thereto.

According to some embodiments of the present inventive concept, a gate contact 166 may be disposed on the gate structure 140. The gate contact 166 may be configured to penetrate the first upper insulating layer 163 and the capping insulating layer 144 in the vertical direction (e.g., the Z direction) to be connected to the gate structure 140. The bottom surface of the gate contact 166 may be disposed on the top surface of the gate structure 140. For example, the bottom surface of the gate contact 166 may be in contact with the top surface of the gate structure 140. The gate contact 166 may include a contact plug made of, for example, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but the constituent material of the gate contact 166 is not limited to those described above. According to some embodiments of the present inventive concept, the gate contact 166 may further include a conductive barrier pattern surrounding a portion of the contact plug. The conductive barrier pattern included in the gate contact 166 may be made of a metal or a metal nitride. For example, the conductive barrier pattern may be formed of Ti, Ta, W, TiN, TaN, WN, WCN, TiSiN, TaSiN, WSiN, or a combination thereof, but the present inventive concept is not limited thereto.

According to some embodiments of the present inventive concept, the top surfaces of the first upper insulating layer 163 and the source/drain via contact 164 may be covered by a second upper insulating layer 172. According to some embodiments of the present inventive concept, the second upper insulating layer 172 may include a tetraethylorthosilicate (TEOS) layer, a high density plasma (HDP) oxide layer, a boro-phospho-silicate glass (BPSG) layer, a flowable chemical vapor deposition (FCVD) oxide layer, a SiON layer, a SiN layer, a SiOC layer, a SiCOH layer, or a combination thereof, but the present inventive concept is not limited thereto.

According to some embodiments of the present inventive concept, the front wiring structure 174 may be disposed to penetrate the second upper insulating layer 172. According to some embodiments of the present inventive concept, the front wiring structure 174 may be connected to the source/drain via contact 164 and the gate contact 166. According to some embodiments of the present inventive concept, the front wiring structure 174 may be made of molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but the present inventive concept is not limited thereto. According to some embodiments of the present inventive concept, the source/drain contact structure 154 and the source/drain via contact 164 may constitute an upper contact to electrically connect the front wiring structure 174 with the second source/drain region 124.

Hereinafter, a method of manufacturing the integrated circuit device 100 according to embodiments will be described. FIGS. 4A to 16B are cross-sectional views illustrating a method of manufacturing an integrated circuit device according to an embodiment of the present inventive concept in a process sequence, and are cross-sectional views taken along an X-X' line, a Y1-Y1' line, a Y2-Y2' line, and a Y3-Y3' line of FIG. 1. More specifically, FIGS. 4A, 5A, 6A, 7A, 8A, 9A, 10A, 11A, 12A, 13A, 14A, 15A, and 16A are cross-sectional views respectively illustrating cross-sectional structures according to a process sequence of a portion corresponding to a cross-section taken along line X-X' of FIG. 1. FIGS. 4B, 5B, 6B, 7B, 8B, 9B, 10B, 11B, 12B, 13B, 14B, 15B, and 16B are cross-sectional views respectively illustrating cross-sectional structures according to a process sequence corresponding to a portion corresponding to a cross-section of lines Y1-Y1', Y2-Y2', and Y3-Y3' of FIG. 1.

Figure 4A:
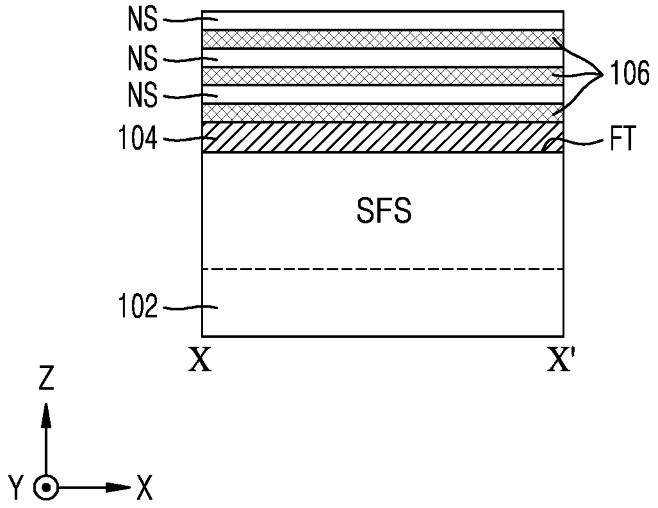
FIGS. 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, and 16B are cross-sectional views illustrating a method of manufacturing an integrated circuit device according to an embodiment of the present inventive concept in a process sequence, and are cross-sectional views taken along an X-X' line, a Y1-Y1' line, a Y2-Y2' line, and a Y3-Y3' line of FIG. 1.
Figure 4B:
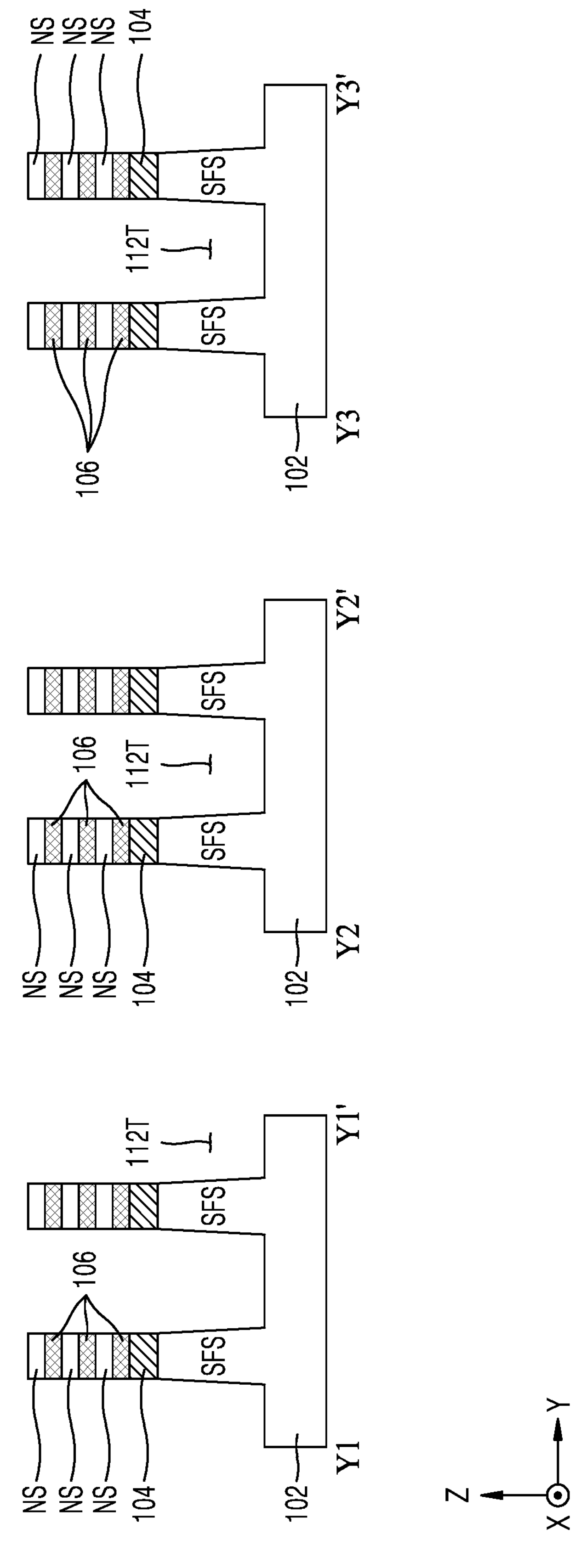

Referring to FIGS. 4A and 4B, a first sacrificial semiconductor layer 104 may be formed on a sacrificial substrate 102, and then a plurality of second sacrificial semiconductor layers 106 and a plurality of nanosheet semiconductor layers NS may be alternately stacked on the first sacrificial semiconductor layer 104.

According to some embodiments of the present inventive concept, the sacrificial substrate 102 may include a semiconductor such as Si or Ge, or a compound semiconductor such as SiGe, SiC, GaAs, InAs, InGaAs, or InP. The terms "SiGe", "SiC", "GaAs", "InAs", "InGaAs", and "InP" used herein refer to materials composed of elements included in each term, and are not chemical formulae representing a stoichiometric relationship.

According to some embodiments of the present inventive concept, the first sacrificial semiconductor layer 104, the plurality of second sacrificial semiconductor layers 106, and the plurality of nanosheet semiconductor layers NS may be formed of semiconductor materials having different etching selectivities. According to some embodiments of the present inventive concept, the plurality of nanosheet semiconductor layers NS may be formed of a Si layer, and the first sacrificial semiconductor layer 104 and the plurality of second sacrificial semiconductor layers 106 may be formed of a SiGe layer. According to some embodiments of the present inventive concept, the first sacrificial semiconductor layer 104 and the plurality of second sacrificial semiconductor layers 106 may have different concentrations of Ge. According to embodiments of the present inventive concept, the SiGe layer constituting the first sacrificial semiconductor layer 104 may have a first Ge concentration, and the SiGe layer constituting the plurality of second sacrificial semiconductor layers 106 may have a second Ge concentration. According to some embodiments of the present inventive concept, the first Ge concentration in the first sacrificial semiconductor layer 104 may be constant, and the second Ge concentration in the plurality of second sacrificial semiconductor layers 106 may be constant. According to some embodiments of the present inventive concept, the first Ge concentration of the first sacrificial semiconductor layer 104 may be greater than the second Ge concentration of the plurality of second sacrificial semiconductor layers 106. According to some embodiments of the present inventive concept, the first Ge concentration of the first sacrificial semiconductor layer 104 may be about 50 at % or more or about 60 at % or more. According to some embodiments of the present inventive concept, the second Ge concentration of each of the plurality of second sacrificial semiconductor layers 106 may range from about 5 at % to about 40 at %.

Thereafter, a portion of each of the sacrificial substrate 102, the first sacrificial semiconductor layer 104, the plurality of second sacrificial semiconductor layers 106, and the plurality of nanosheet semiconductor layers NS may be etched to form a device isolation trench 112T. For example, a plurality of sacrificial fin structures SFS may be defined by the device isolation trench 112T. According to some embodiments of the present inventive concept, the plurality of sacrificial fin structures SFS may extend in parallel to each other in the first horizontal direction (e.g., the X direction). According to some embodiments of the present inventive concept, a stack structure of the first sacrificial semiconductor layer 104, the plurality of second sacrificial semiconductor layer 106, and the plurality of nanosheet semiconductor layers NS may remain on the top surface FT of each of the plurality of sacrificial fin structures SFS.

Figure 5A:
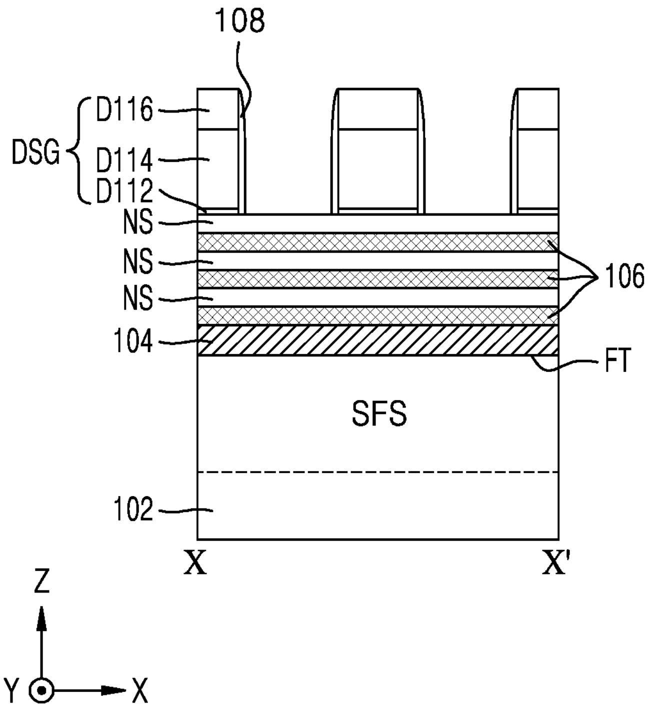
Figure 5B:
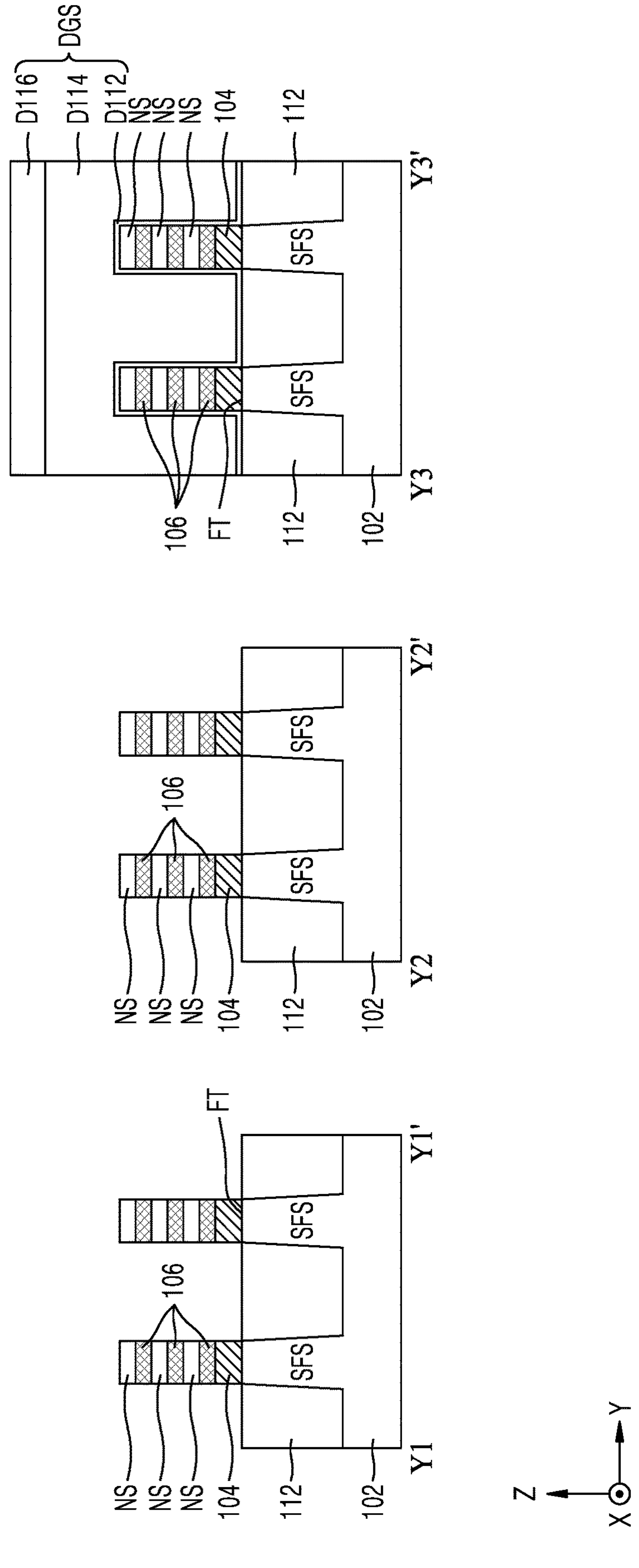

Referring to FIGS. 5A and 5B, a device isolation layer 112 may be formed to cover both sidewalls of each of the plurality of sacrificial fin structures SFS and fill the device isolation trench 112T of FIG. 4B. According to some exemplary embodiments of the present inventive concept, the top surface of the device isolation layer 112 may be at the same or similar level at which the top surface FT of each of the plurality of sacrificial fin structures SFS is located.

Thereafter, on top of the stack structure of the first sacrificial semiconductor layer 104, the plurality of second sacrificial semiconductor layers 106, and the plurality of nanosheet semiconductor layers NS, a plurality of dummy gate structures DSG and outer insulating spacers 108 covering both sidewalls of the plurality of dummy gate structures DSG may be formed. According to some embodiments of the present inventive concept, the plurality of dummy gate structures DSG may extend in parallel to each other in the second horizontal direction (e.g., the Y direction) at positions corresponding to the plurality of gate structures 140 illustrated in FIG. 1.

According to some embodiments of the present inventive concept, the plurality of dummy gate structures DGS may each have a structure in which a dummy oxide layer D112, a dummy gate layer D114, and a capping layer D116 are stacked in order. According to some embodiments of the present inventive concept, the dummy gate layer D114 may be formed of a polysilicon layer, and the capping layer D116 may be formed of a silicon nitride layer.

Figure 6A:
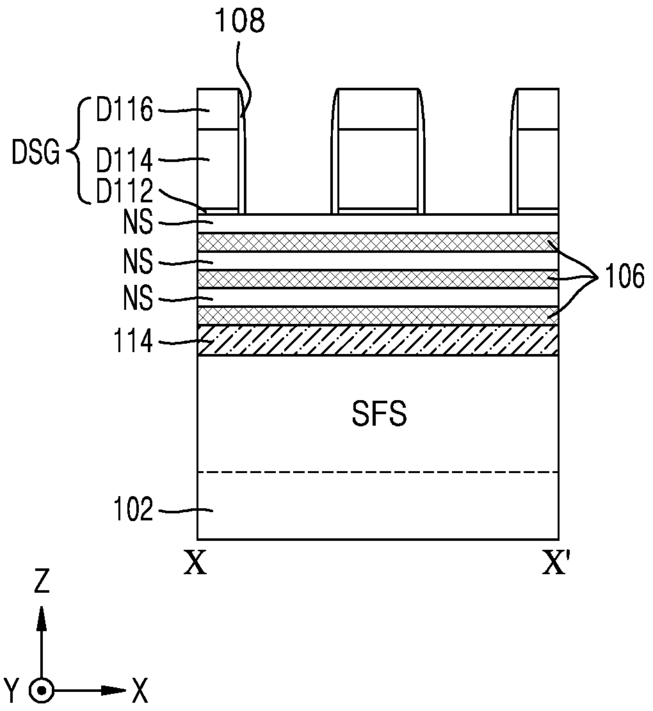
Figure 6B:
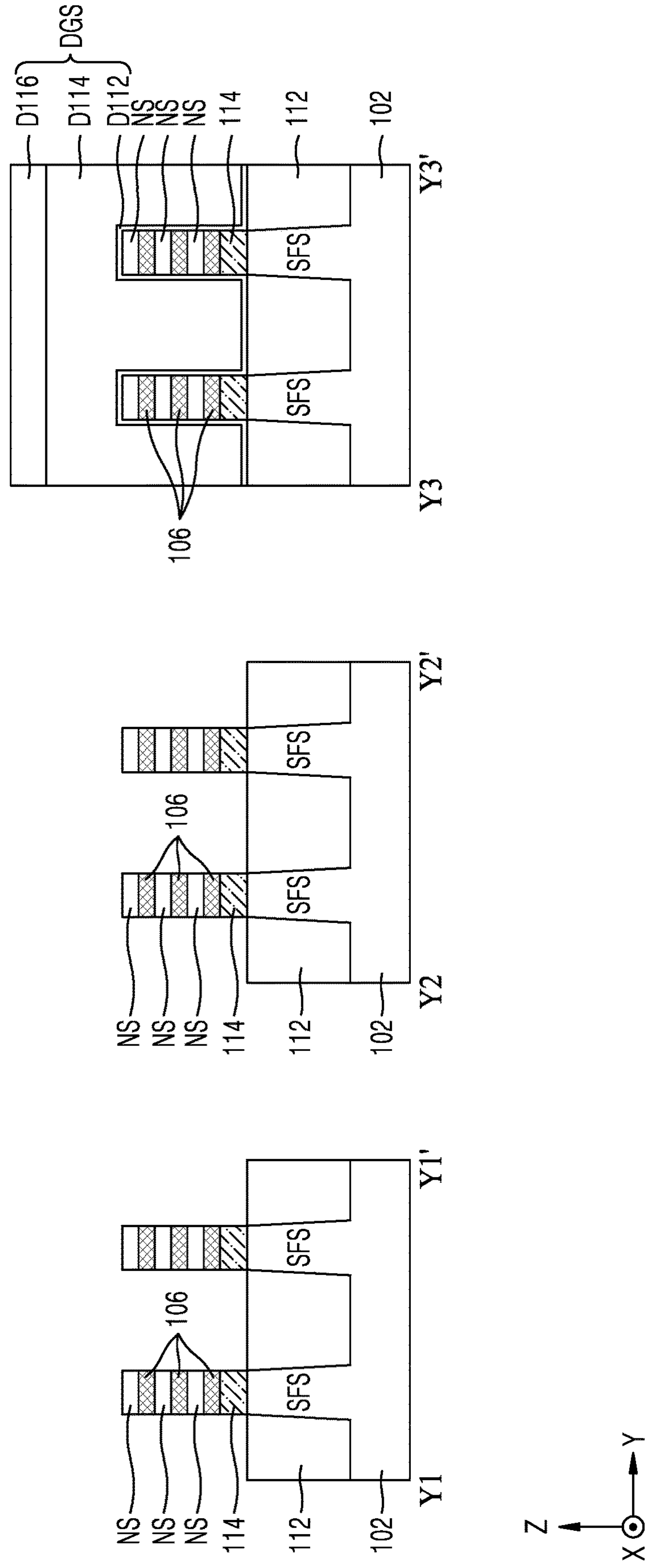

Referring to FIGS. 6A and 6B, after the first sacrificial semiconductor layer 104 is removed, a lower insulating layer 114 may be formed in a space in which the first sacrificial semiconductor layer 104 was disposed.

According to some embodiments of the present inventive concept, the first sacrificial semiconductor layer 104 may be selectively removed by utilizing the different etching selectivities between the first sacrificial semiconductor layer 104, the second sacrificial semiconductor layer 106, and the plurality of nanosheet semiconductor layers NS. According to some embodiments of the present inventive concept, a liquid or gaseous etchant may be used to selectively remove the first sacrificial semiconductor layer 104. The etchant may be formed of, for example, a $CH_3COOH$-based etchant, for example, an etchant formed of a mixture of $CH_3COOH$, $HNO_3$, and HF, or an etchant formed of a mixture of $CH_3COOH$, $H_2O_2$, and HF, but the present inventive concept is not limited thereto. According to some embodiments of the present inventive concept, the lower insulating layer 114 may be formed through an atomic layer deposition (ALD) process, a chemical vapor deposition (CVD), a plasma-enhanced CVD (PECVD) process, and a low-pressure CVD (LPCVD) process, but the present inventive concept is not limited to the above.

Figure 7A:
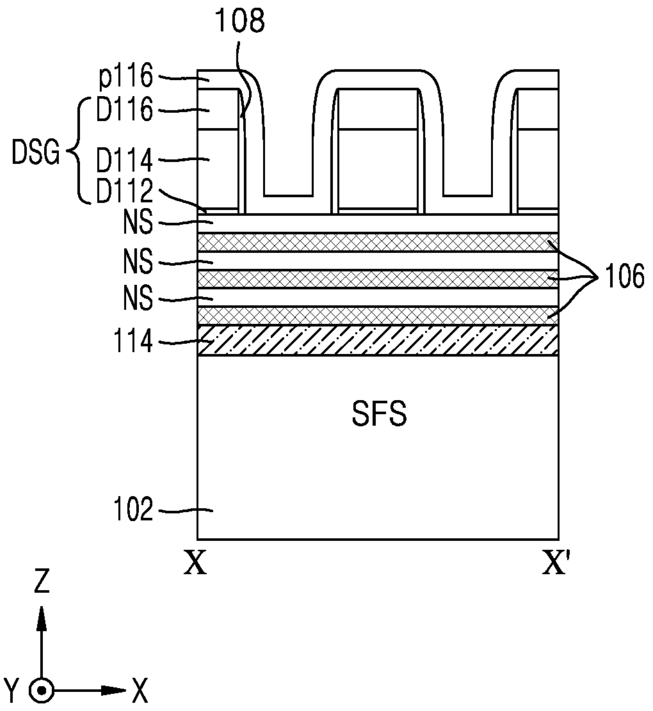
Figure 7B:
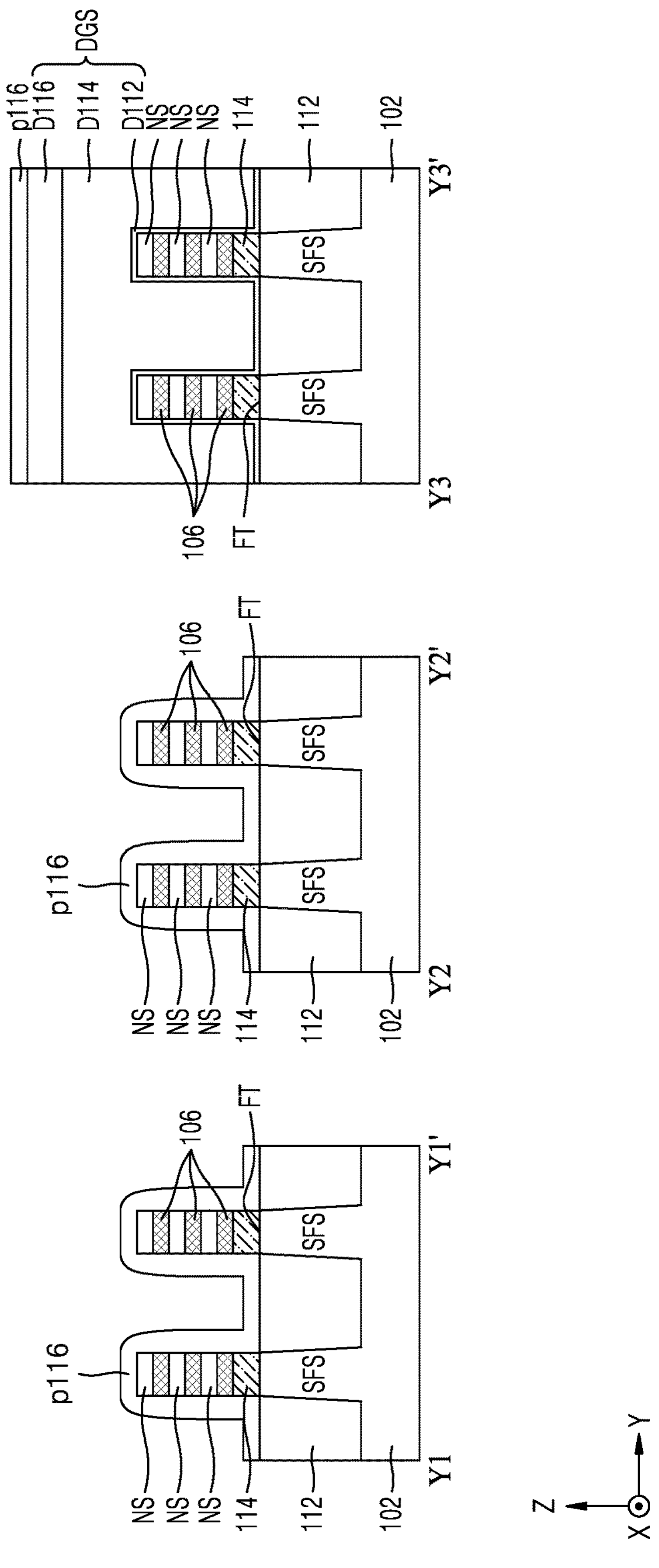

Referring to FIGS. 7A and 7B, in the results of FIGS. 6A and 6B, a spacer layer p116 covering the top surfaces of the dummy gate structures DGS, the outer insulating spacers 108, and the device isolation layer 112, both sidewalls of the lower insulating layer 114, both sidewalls of the plurality of nanosheet semiconductor layers NS, and both sidewalls of the plurality of second sacrificial semiconductor layers 106, which are not covered by the dummy gate structures DGS, may be formed. According to some embodiments of the present inventive concept, the spacer layer p116 may be formed of SiOCN. In some embodiments of the present inventive concept, the spacer layer p116 may include a SiOCN layer covering the outer insulating spacer 108 and an oxide layer covering the SiOCN layer.

In FIGS. 7A and 7B, as a result that the top surface of the device isolation layer 112 is at the same vertical level as the top surfaces FT of the plurality of sacrificial fin structures SFS and the device isolation layer 112 covers both sidewalls of each of the plurality of sacrificial fin structures SFS, it has been illustrated that the spacer layer p116 does not contact the plurality of sacrificial fin structures SFS, but the present inventive concept is not limited thereto. For example, the top surface of the device isolation layer 112 may be lower than the top surfaces FT of the plurality of sacrificial fin structures SFS, and the spacer layer p116 may cover a portion of both exposed sidewalls of the plurality of sacrificial fin structures SFS.

Figure 8A:
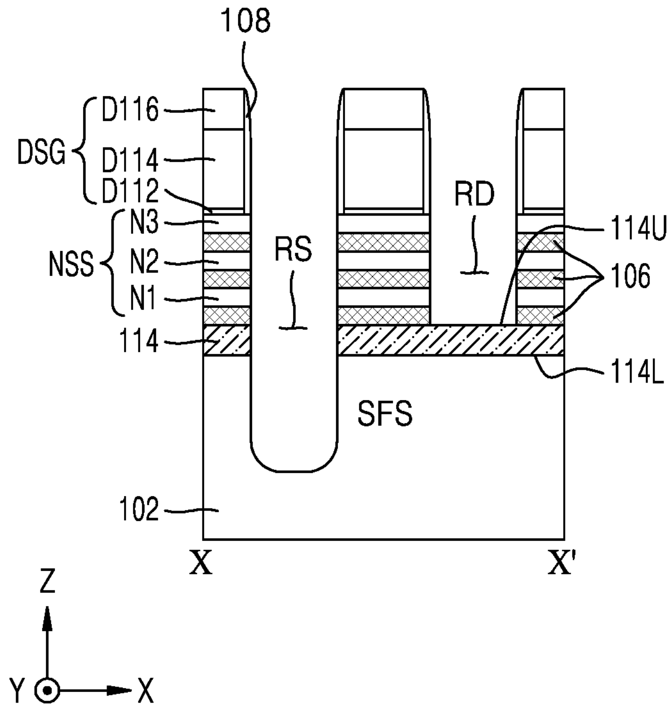
Figure 8B:
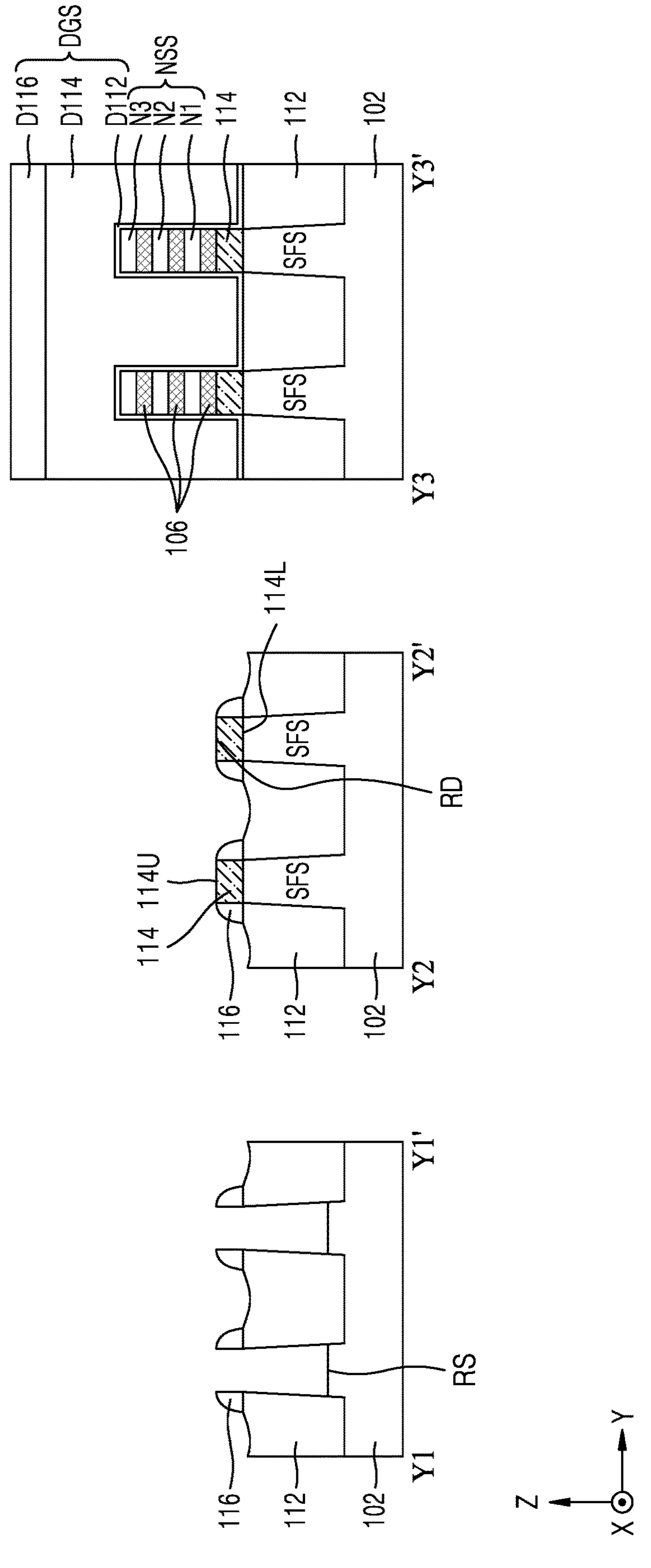

Referring to FIGS. 8A and 8B, in the results of FIGS. 7A and 7B, the plurality of dummy gate structures DGS and the outer insulating spacers 108 may be used as etching masks to etch a portion of each of the plurality of second sacrificial semiconductor layers 106, the plurality of nanosheet semiconductor layers NS, the lower insulating layers 114, and portions of the plurality of sacrificial fin structures SFS to thereby divide the plurality of nanosheet semiconductor layers NS into the plurality of nanosheet stacks NSS including the first nanosheet N1, the second nanosheet N2, and the third nanosheet N3, respectively, and form a first recess RS and/or a second recess RD on an upper portion of each of the plurality of sacrificial fin structures SFS. In this case, the spacer layer p116 may be partially etched together to form a recess-side insulating spacer 116 disposed adjacent to the first recess RS and the second recess RD on the device isolation layer 112.

According to some embodiments of the present inventive concept, the first recess RS may be formed by etching a portion of each of the plurality of second sacrificial semiconductor layers 106, the plurality of nanosheet semiconductor layers NS, the lower insulating layers 114, and portions of the plurality of sacrificial fin structures SFS. According to some embodiments of the present inventive concept, the bottom surface of the first recess RS may be formed to be lower than the bottom surface 114L of the lower insulating layer 114. According to some embodiments of the present inventive concept, the second recess RD may be formed by etching a portion of each of the plurality of second sacrificial semiconductor layers 106 and the plurality of nanosheet semiconductor layers NS, and the top surfaces 114U of the lower insulating layers 114 may be exposed through the second recess RD.

According to some embodiments of the present inventive concept, the first recess RS may be formed by etching a portion of each of the plurality of second sacrificial semiconductor layers 106 and the plurality of nanosheet semiconductor layers NS so that the top surfaces 114U of the lower insulating layers 114 are exposed, disposing a mask pattern covering the second recess RD, and additionally etching a portion of each of the lower insulating layers 114 and a portion of each of the plurality of sacrificial fin structures SFS. For example, dry etching, wet etching, or a combination thereof may be used to form, for example, the first recess RS and the second recess RD.

Figure 9A:
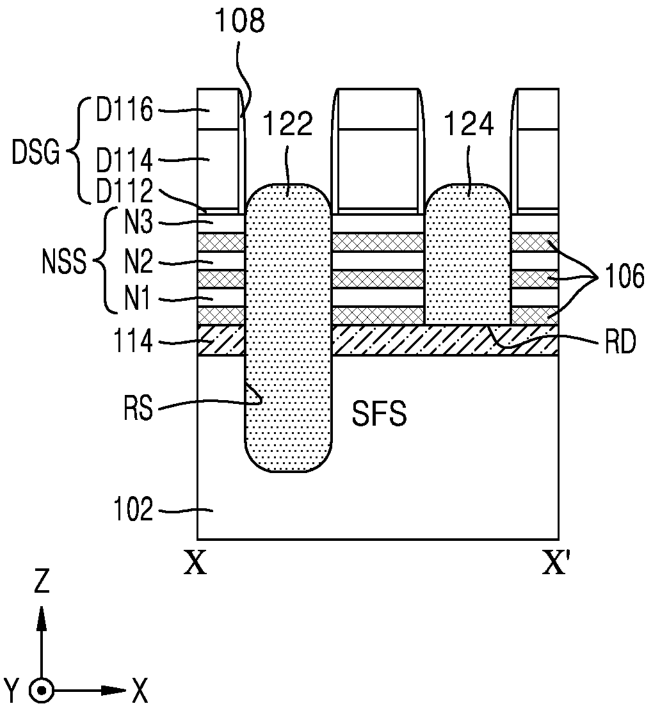
Figure 9B:
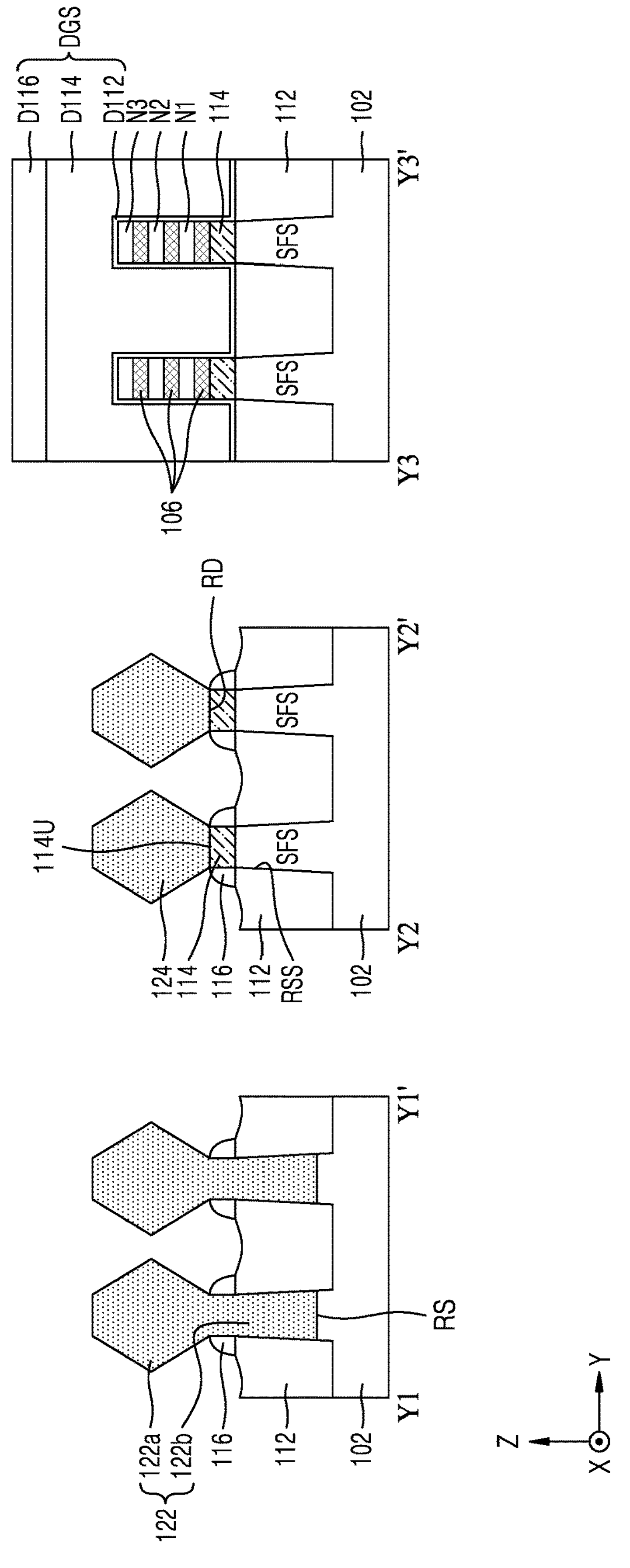

Referring to FIGS. 9A and 9B, in the results of FIGS. 8A and 8B, the first source/drain regions 122 filling the first recesses RS and the second source/drain regions 124 filling the second recesses RD may be formed.

According to some embodiments of the present inventive concept, to form the first and second source/drain regions 122 and 124, raw materials including element semiconductor precursors may be used to perform a low-pressure chemical vapor deposition (LPCVD) process, a selective epitaxial growth (SEG) process, or a cyclic deposition and etching process (CDE). In some embodiments of the present inventive concept, the first and second source/drain regions 122 and 124 may be formed by epitaxially growing semiconductor materials from sidewalls of each of the first nanosheet N1, the second nanosheet N2, and the third nanosheet N3 included in each of the plurality of nanosheet stacks NSS.

Figure 10A:
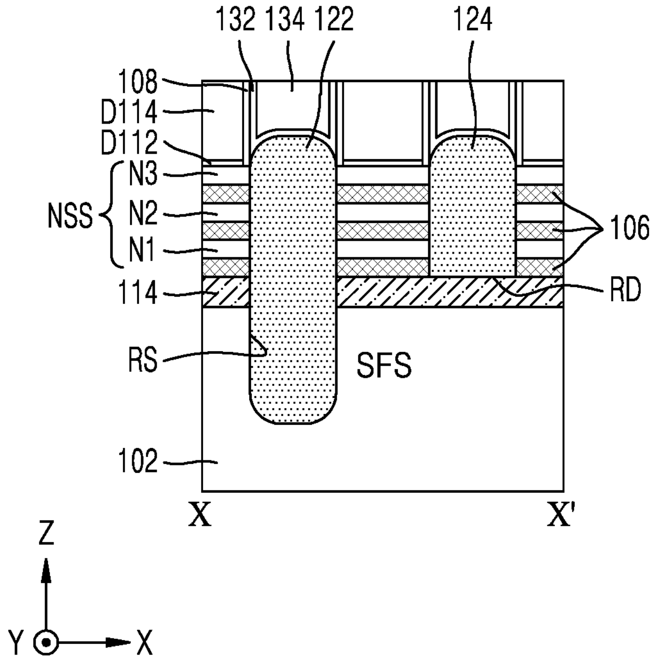
Figure 10B:
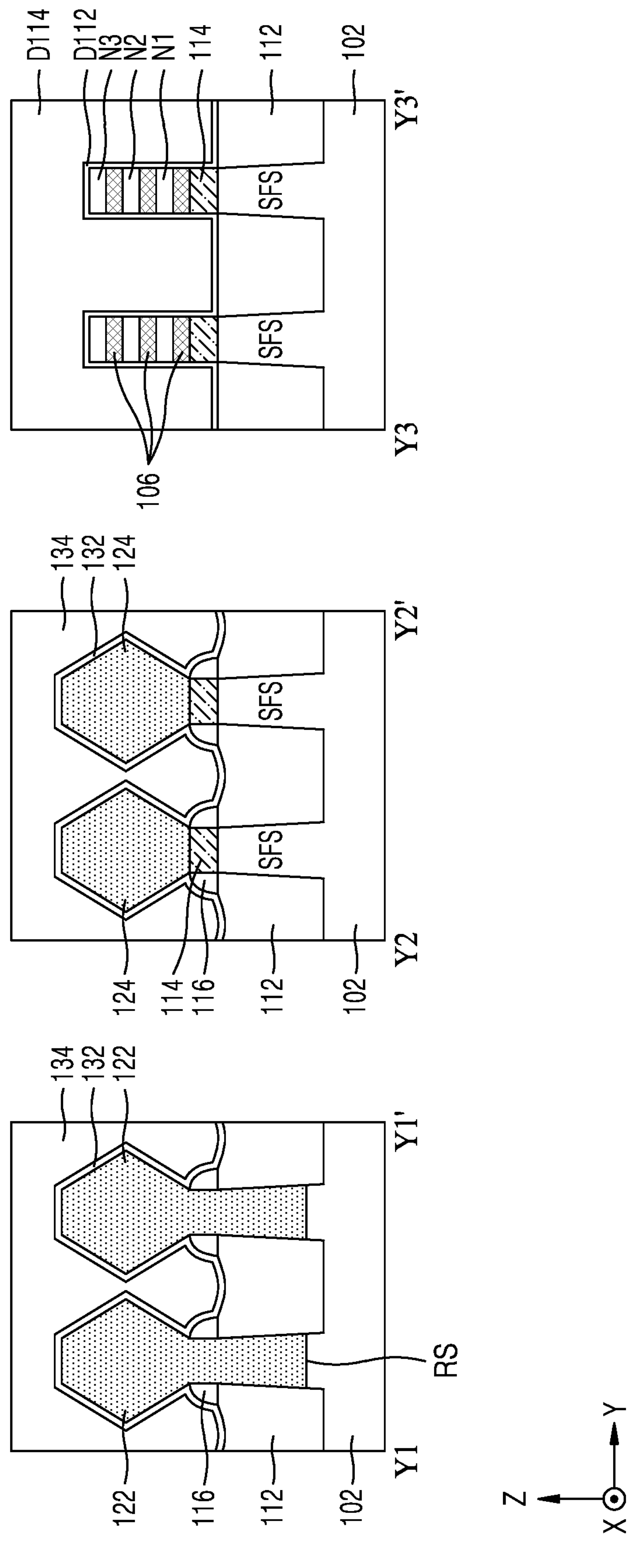

Referring to FIGS. 10A and 10B, an insulating liner 132 is formed to cover the resultant structure of FIGS. 9A and 9B, an inter-gate insulating layer 134 is formed on the insulating liner 132, and a portion of each of the insulating liner 132 and the inter-gate insulating layer 134 is etched to expose the top surface of the capping layer D116. Thereafter, the capping layer D116 is removed, and the plurality of outer insulating spacers 108, the insulating liner 132, and the inter-gate insulating layer 134 are planarized to expose the top surface of the dummy gate layer D114.

Figure 11A:
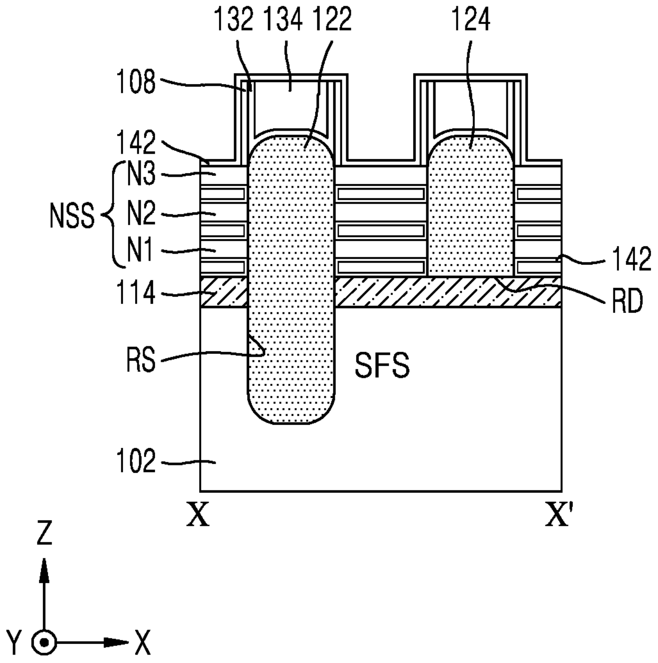

Referring to FIGS. 11A and JIB, a gate space GS may be prepared by removing the dummy gate layer D114 and the oxide layer D112 thereunder from the results of FIGS. 10A and 10B, and the plurality of nanosheet stacks NSS may be exposed through the gate space GS. Thereafter, the plurality of second sacrificial semiconductor layers 106 remaining on the lower insulating layers 114 are removed through the gate space GS that is on each of the nanosheet stacks NSS and extend up to the space between the nanosheets N1 and N2, and N2 and N3 of the plurality of nanosheets N1, N2, and N3 and the space between the first nanosheet N1 and the top surface of the lower insulation layer 114. According to some embodiments of the present inventive concept, differences in etching selectivities between the first nanosheet N1, the second nanosheet N2, and the third nanosheet N3 and the plurality of second sacrificial semiconductor layers 106 may be used to selectively remove the plurality of second sacrificial semiconductor layers 106.

According to some embodiments of the present inventive concept, a liquid or gaseous etchant may be used to selectively remove the plurality of second sacrificial semiconductor layers 106. According to some embodiments of the present inventive concept, to selectively remove the plurality of second sacrificial semiconductor layers 106, a $CH_3COOH$-based etchant, for example, an etchant formed of a mixture of $CH_3COOH$, $HNO_3$, and HF, or an etchant formed of a mixture of $CH_3COOH$, $H_2O_2$, and HF, may be used, but the etchant is not limited to those described above.

Thereafter, the gate dielectric layer 142 covering the exposed surfaces of the plurality of nanosheets N1, N2, and N3 may be formed. The gate dielectric layer 142 may be formed to conformally cover the surfaces of the lower insulating layers 114, which are exposed through the gate space GS, the surfaces of the outer insulating spacers 108, and the surfaces of the inter-gate insulating layers 134. For example, the gate dielectric layer 142 may be formed through an ALD process.

Figure 11B:
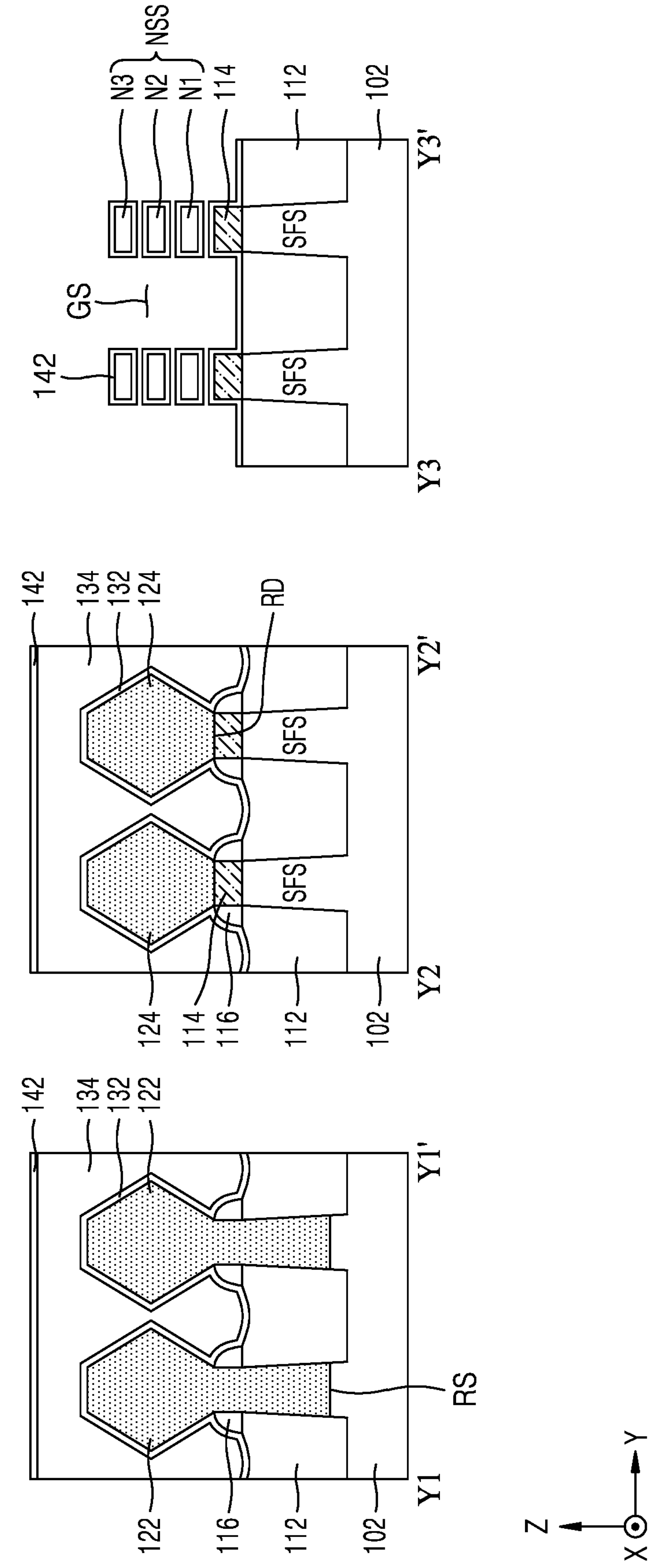
Figure 12A:
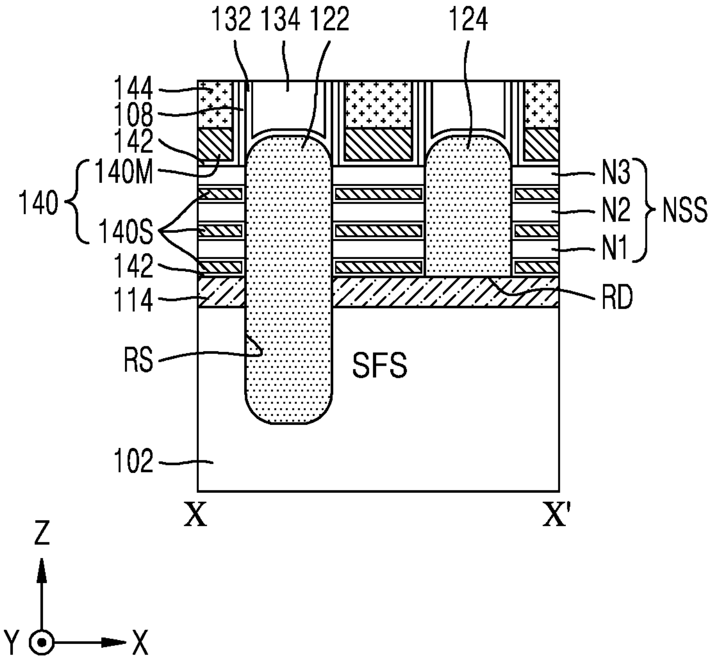
Figure 12B:
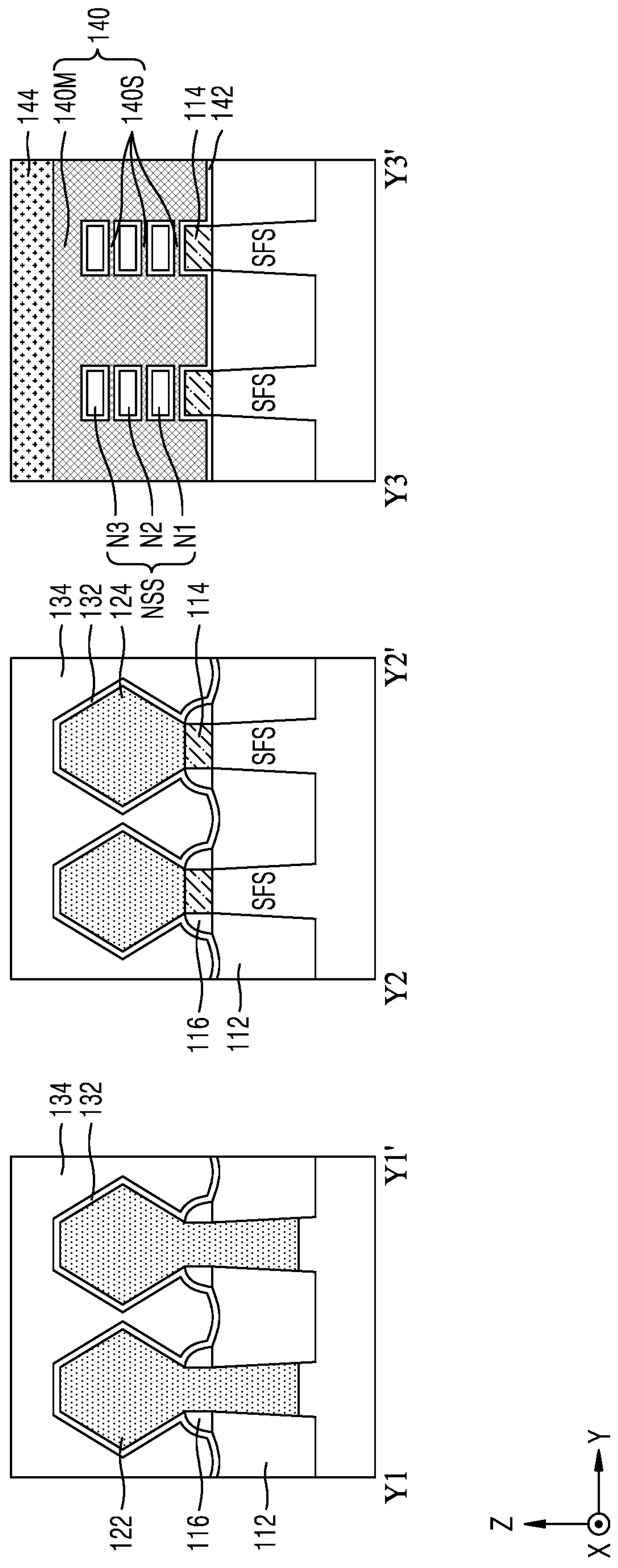

Referring to FIGS. 12A and 12B, in the resultant structure of FIGS. 11A and 11B, a gate structure 140 covering the top surface of the inter-gate insulating layer 134 while filling the gate space GS on the gate dielectric layer 142, and a capping insulating layer 144 covering the top surface of each of the gate structure 140 and the gate dielectric layer 142 in the gate space GS may be formed. Thereafter, the capping insulating layer 144, the gate dielectric layer 142, the outer insulating spacer 108, the insulating liner 132, and the inter-gate insulating layer 134 may be planarized, and thus, the top surface of the inter-gate insulating layer 134 may be exposed. For example, portions of the gate structure 140 that are covering the top surface of the inter-gate insulating layer 134 may be removed.

Figure 13A:
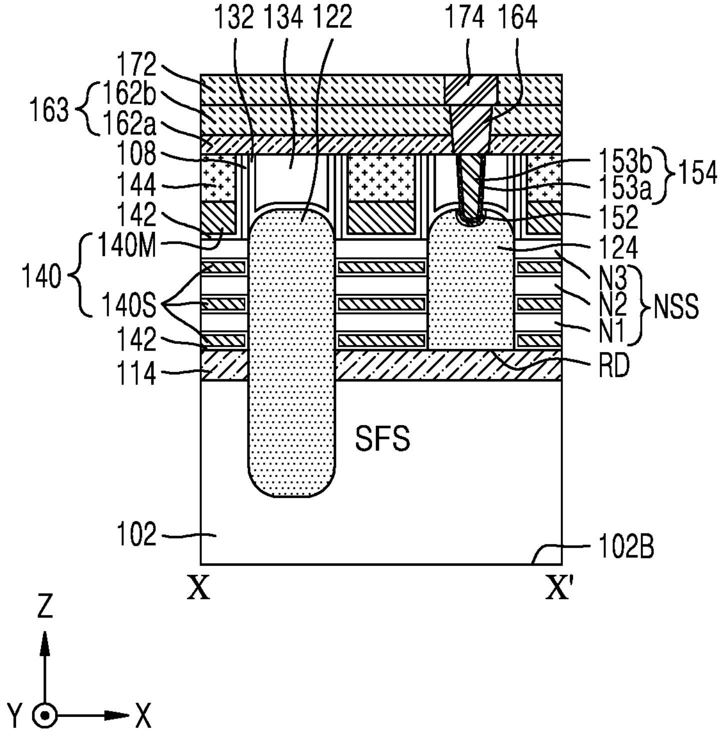
Figure 13B:
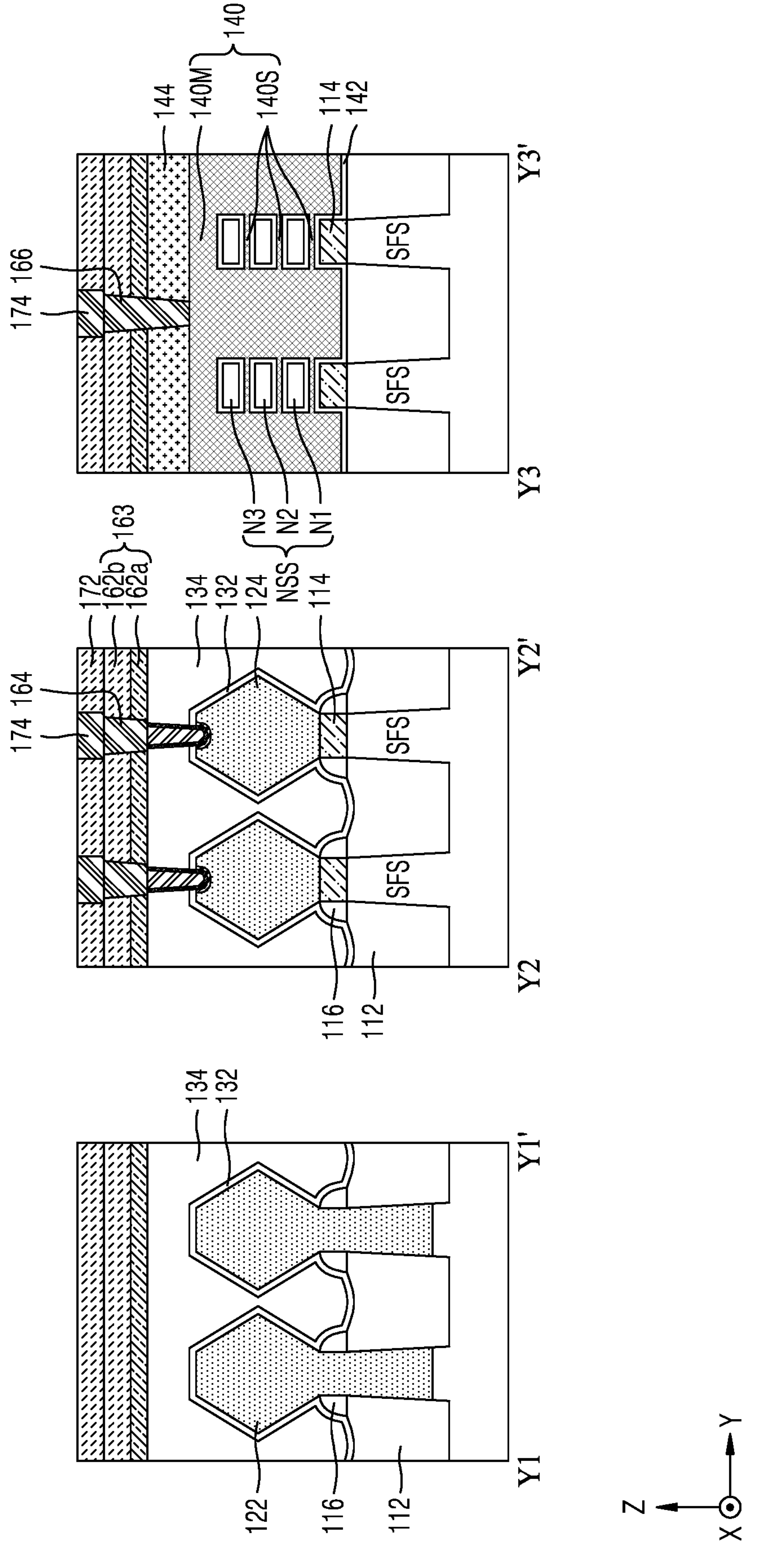

Referring to FIGS. 13A and 13B, in the results of FIGS. 12A and 12B, a source/drain contact hole exposing the second source/drain region 124 may be formed through the insulating liner 132 and the inter-gate insulating layer 134, and then some areas of the second source/drain region 124 may be removed by an anisotropic etching process through the source/drain contact hole to thereby have the source/drain contact hole extend toward the sacrificial substrate 102. Thereafter, the upper silicide layer 152 may be formed on the second source/drain region 124 exposed from the bottom side of the source/drain contact hole. Thereafter, the source/drain contact structure 154 including the conductive barrier 153*a* and the contact plug 153*b* may be formed on the upper silicide layer 152.

Thereafter, the first upper insulation layer 163 may be formed by sequentially forming an etch stop layer 162*a* and an interlayer insulation layer 162*b* covering the top surface of each of the inter-gate insulation layer 134, the source/drain contact structure 154, and the capping insulation layer 144. Thereafter, the gate contact 166 connected to the gate structure 140 may be formed by penetrating, in the vertical direction (e.g., the Z direction), the first upper insulating layer 163 and the capping insulating layer 144. In addition, the source/drain via contact 164 may be formed by penetrating the first upper insulating layer 163 to be connected to the source/drain contact structure 154. The sequence of forming the source/drain via contact 164 and the gate contact 166 is not particularly limited.

Thereafter, a second upper insulating layer 172 covering the first upper insulating layer 163 and a front wiring structure 174, which is connected to the source/drain via contact 164 and the gate contact 166 by penetrating the second upper insulating layer 172, may be formed. The front wiring structure 174 may extend in the horizontal direction (e.g., the X direction and/or Y direction) on the first upper insulating layer 163.

Figure 14A:
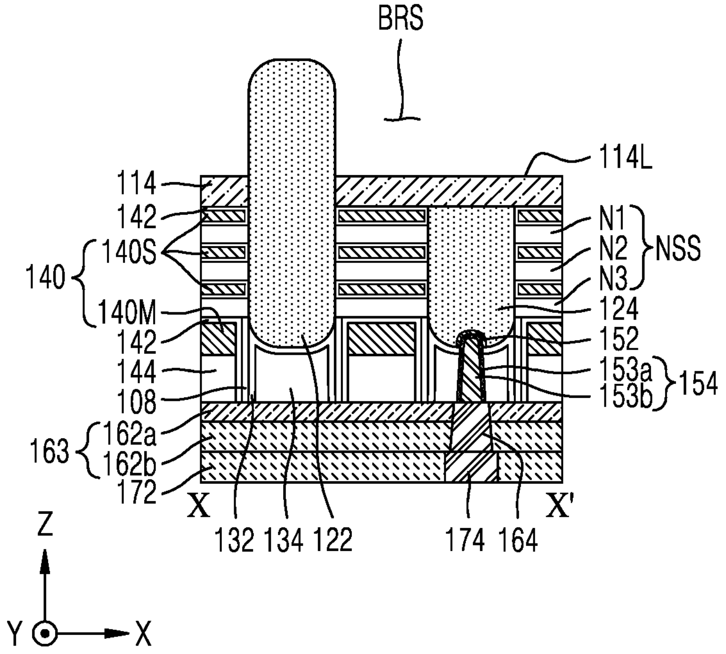
Figure 14B:
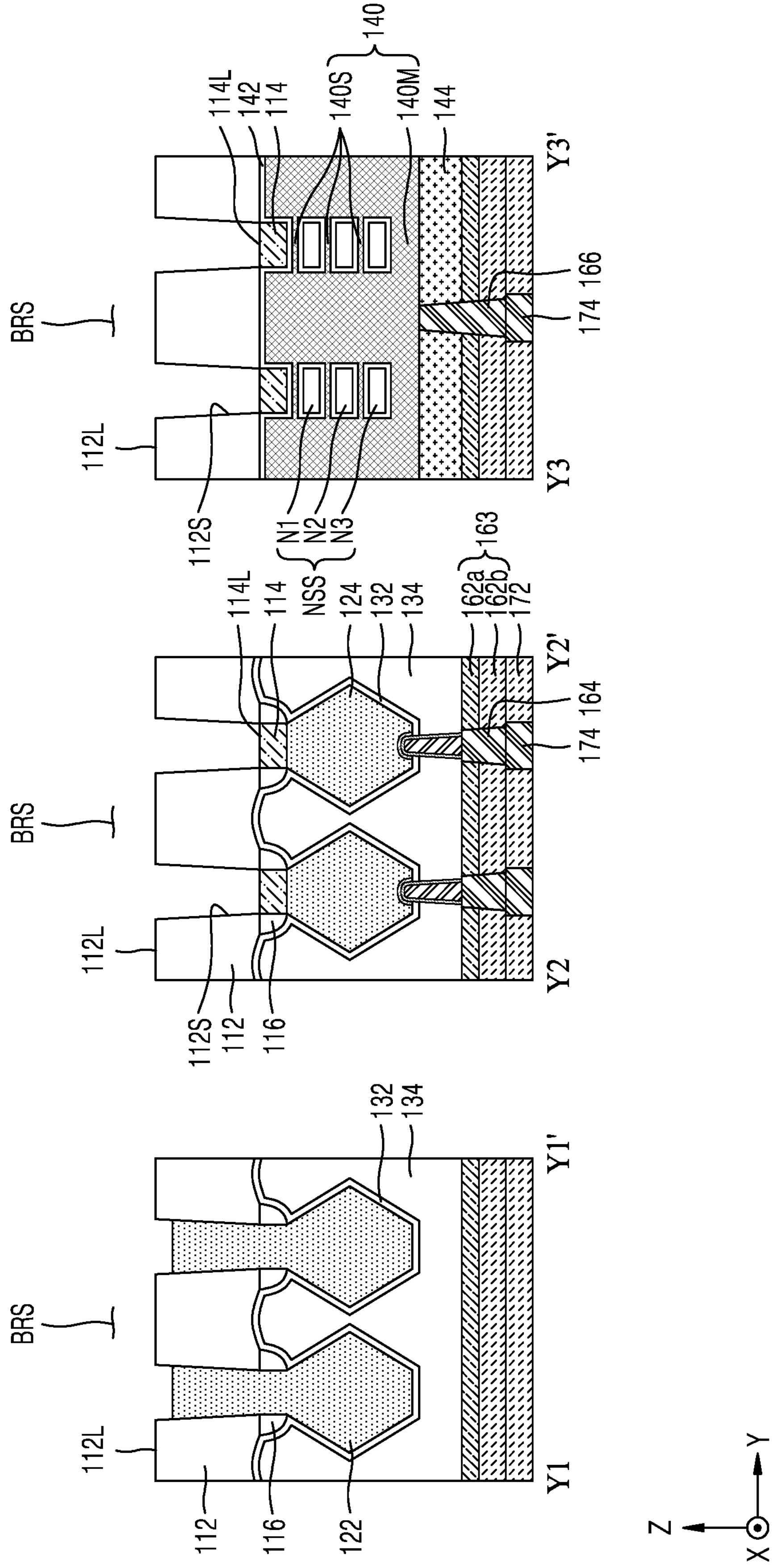

Referring to FIGS. 14A and 14B, after a carrier substrate is attached on the second upper insulating layer 172, the resultant structure of FIGS. 13A and 13B is flipped, and then an etching process is performed on the rear surface 102*b* of the sacrificial substrate 102 to remove the sacrificial substrate 102, thereby forming a backside recess BRS. For example, a buffer layer may be disposed between the carrier substrate and the second upper insulating layer 172.

According to some embodiments of the present inventive concept, the bottom surface 112L and the side surface 112S of the device isolation layer 112, and the bottom surface 114L of the lower insulating layer 114 may be exposed through the backside recess BRS. The vertical extension portion 122*b* of the first source/drain region 122 protruding above the bottom surface 114L of the lower insulating layer 114 may be exposed through the backside recess BRS. According to some embodiments of the present inventive concept, the second source/drain region 124 may be covered by the lower insulating layer 114 and might not be exposed through the backside recess BRS.

Figure 15A:
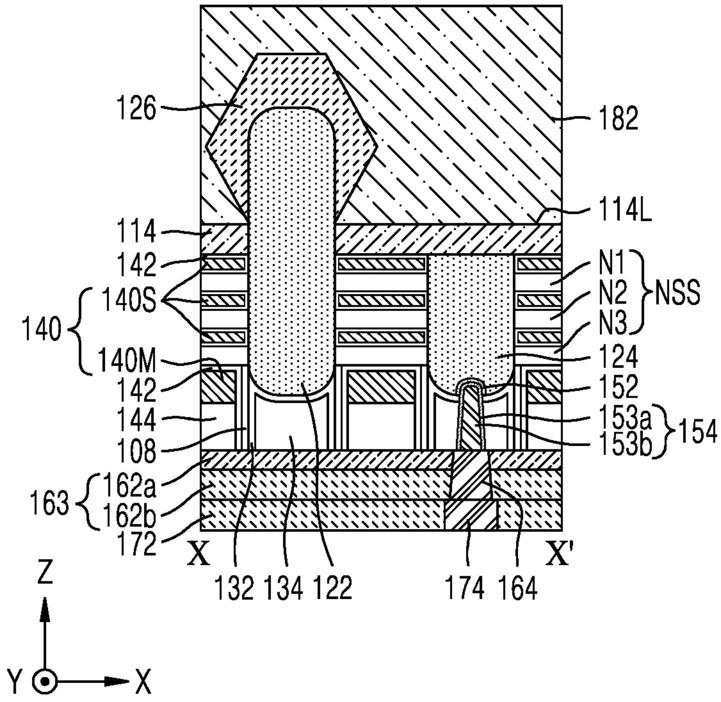
Figure 15B:
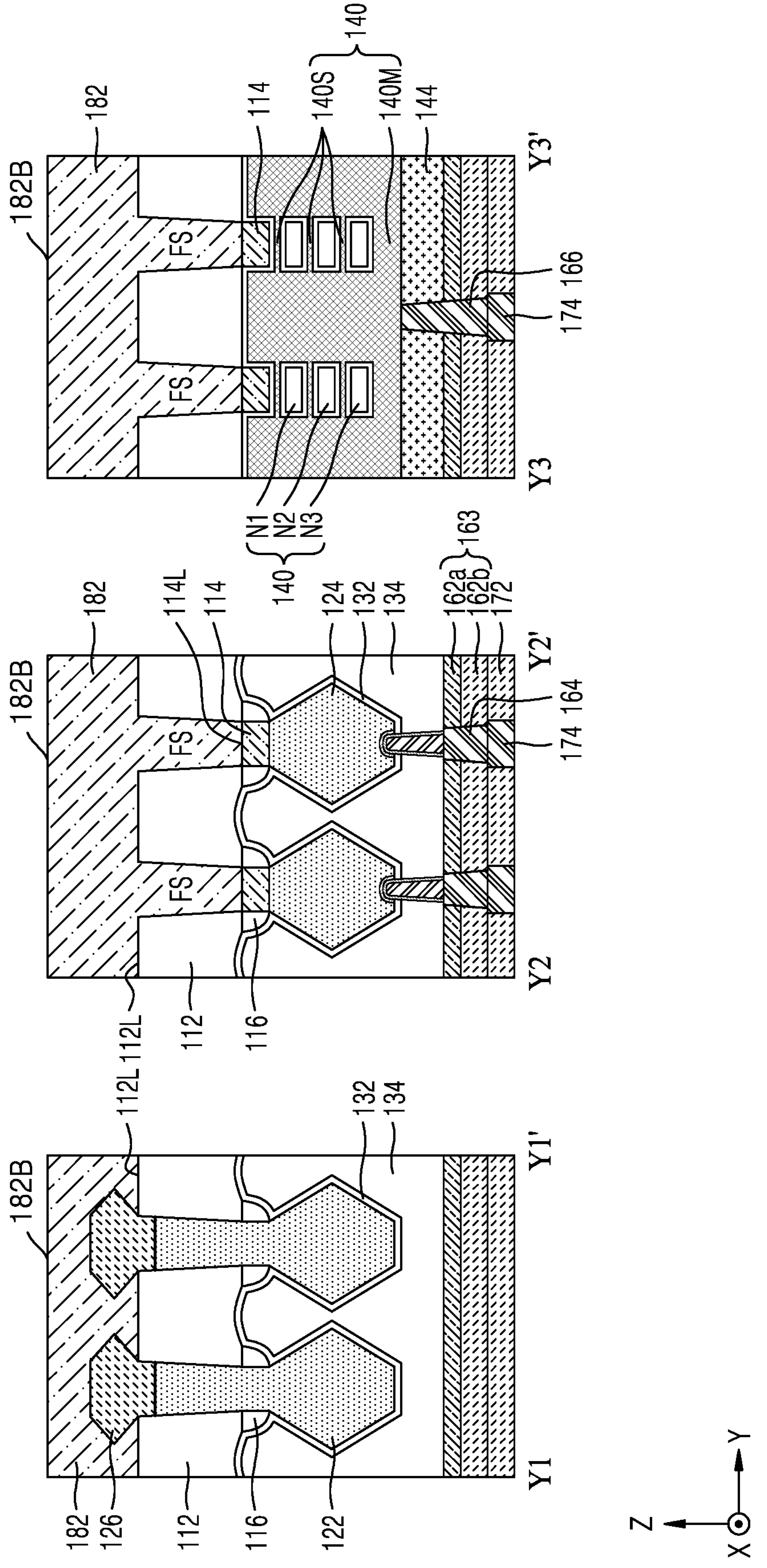

Referring to FIGS. 15A and 15B, in the results of FIGS. 14A and 14B, a semiconductor epitaxial structure 126 may be formed by epitaxially growing a semiconductor material from the vertical extension portion 122*b* of the exposed first source/drain region 122. According to some embodiments of the present inventive concept, the vertical extension portion 122*b* protrudes above the bottom surface 114L of the lower insulating layer 114, and the semiconductor epitaxial structure 126 may be formed to have an extended structure in the horizontal direction (e.g., the X direction and/or the Y direction). Thereafter, the insulating substrate 182 may be formed to cover the exposed portions of the device isolation layer 112, the lower insulating layer 114, and the semiconductor epitaxial structure 126.

Figure 16A:
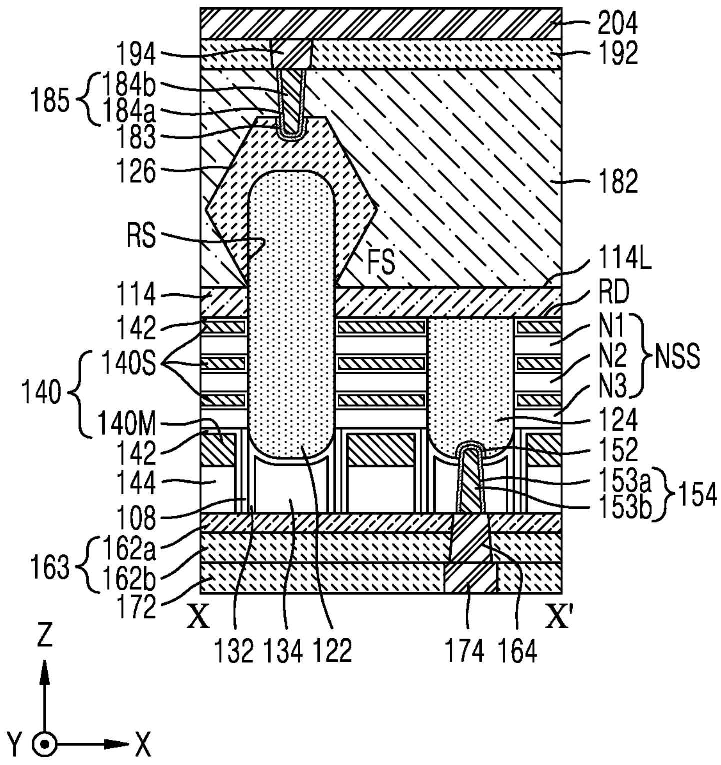
Figure 16B:
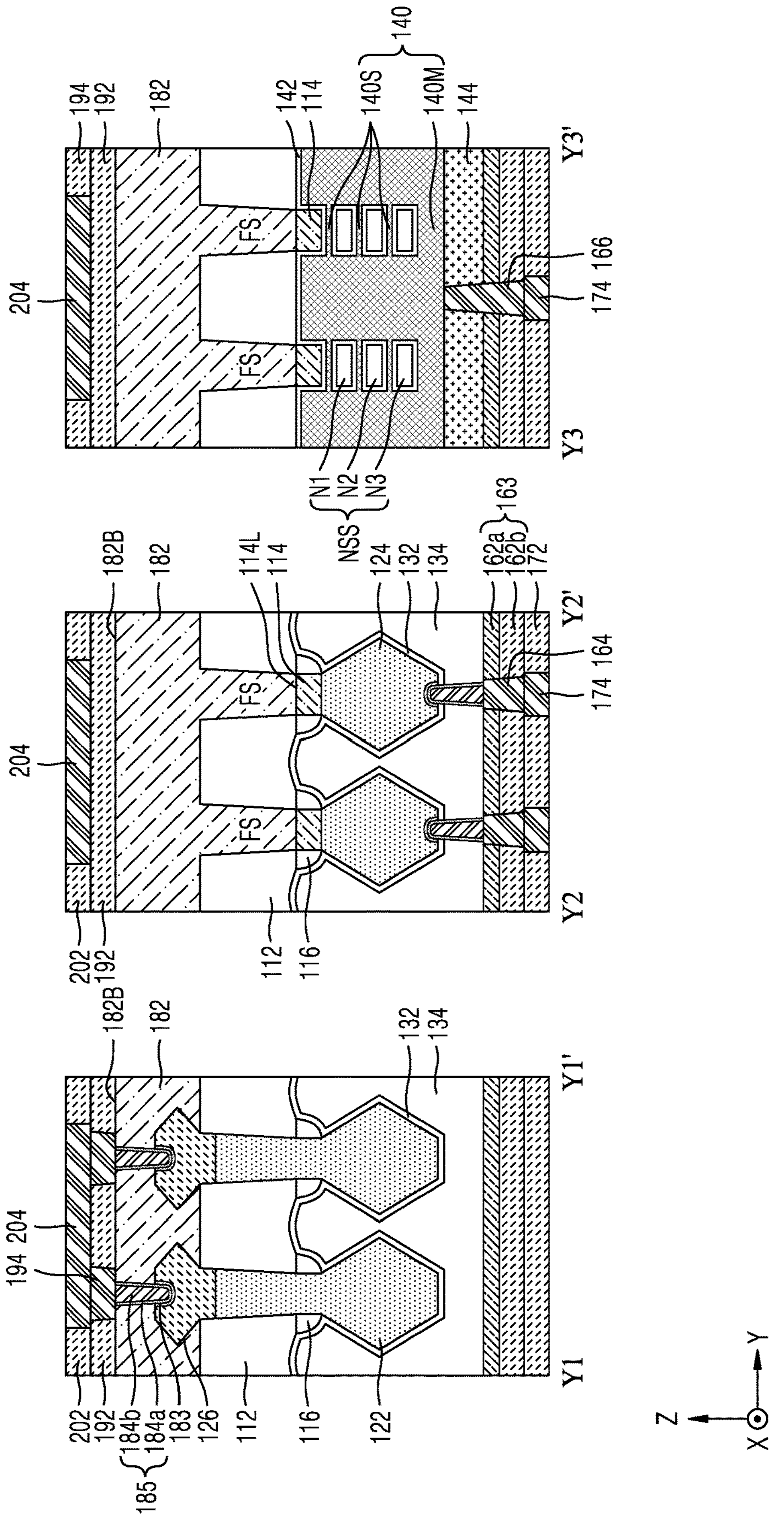

Referring to FIGS. 16A and 16B, in the results of FIGS. 15A and 15B, a lower contact hole which exposes the semiconductor epitaxial structure 126 by penetrating the insulating substrate 182 may be formed and then, a portion of the semiconductor epitaxial structure 126 may be removed through the lower contact hole by an anisotropic etching process so that the lower contact hole may extend longer toward the first source/drain region 122. Thereafter, a lower silicide layer 183 may be formed on the semiconductor epitaxial structure 126 that is exposed from the bottom side of the lower contact hole. Thereafter, a lower contact structure 185 including a conductive barrier 184*a* and a contact plug 184*b* may be formed on the lower silicide layer 183.

Thereafter, a first lower insulating layer 192, which covers the rear surface 182B of the insulating substrate 182 and the lower contact structure 185, may be formed. Thereafter, a lower via contact 194 connected to the lower contact structure 185 may be formed by penetrating the first lower insulating layer 192 in the vertical direction (e.g., the Z direction). Thereafter, a second lower insulating layer 202, which covers the first lower insulating layer 192, and a rear wiring structure 204, which is connected to the lower via contact 194 by penetrating the second lower insulating layer 202, may be formed. Then, after removing the carrier substrate that is attached on the second upper insulation layer 172, and performing flipping, the integrated circuit device 100 of FIG. 1 according to FIGS. 2A and 2B may be obtained.

While the present inventive concept has been described with reference to example embodiments thereof, it will be understood by those of ordinary skill in the art that various changes in form and details may be made thereto without departing from the spirit and scope of the present inventive concept.

What is claimed is:

1. An integrated circuit device comprising:

a rear wiring structure;

an insulating substrate disposed on the rear wiring structure and including a plurality of fin structures extending in a first horizontal direction;

a device isolation layer disposed between the plurality of fin structures;

a lower insulating layer covering top surfaces of the plurality of fin structures;

a plurality of gate structures extending in a second horizontal direction crossing the first horizontal direction on the insulating substrate;

a plurality of nanosheet stacks disposed on the lower insulating layer and at least partially surrounded by the plurality of gate structures;

a first source/drain region disposed on the insulating substrate and including a body portion and a vertical extension portion, wherein the body portion is disposed between the plurality of nanosheet stacks, and the vertical extension portion passes through the lower insulating layer and at least partially passes through a corresponding one of the plurality of fin structures;

a semiconductor epitaxial structure at least partially surrounding the vertical extension portion of the first source/drain region; and a lower contact connecting the semiconductor epitaxial structure with the rear wiring structure;

wherein a sidewall of the semiconductor epitaxial structure comprises a portion with a positive profile that extends to increase a width of the semiconductor epitaxial structure in the first horizontal direction as the sidewall of the semiconductor epitaxial structure moves away from a bottom surface of the lower insulating layer.

2. The integrated circuit device of claim 1, wherein a width of the semiconductor epitaxial structure in the first horizontal direction is greater than a width of the vertical extension portion of the first source/drain region in the first horizontal direction.

3. The integrated circuit device of claim 1, wherein a width of the semiconductor epitaxial structure in the second horizontal direction is greater than a width of the vertical extension portion of the first source/drain region in the second horizontal direction.

4. The integrated circuit device of claim 1, wherein a width of the body portion of the first source/drain region in the second horizontal direction is greater than a width of the vertical extension portion of the first source/drain region in the second horizontal direction.

5. The integrated circuit device of claim 1, wherein a bottom surface of the semiconductor epitaxial structure is placed at a vertical level lower than a bottom surface of the vertical extension portion of the first source/drain region with respect to a bottom surface of the lower insulating layer.

6. The integrated circuit device of claim 1, wherein a bottom surface of the semiconductor epitaxial structure is disposed at a vertical level lower than a bottom surface of the device isolation layer and a top surface of the semiconductor epitaxial structure is disposed at a higher level than the bottom surface of the device isolation layer.

7. The integrated circuit device of claim 1, further comprising a second source/drain region spaced apart from the first source/drain region in the first horizontal direction with a first gate structure of the plurality of gate structures disposed between the first source/drain region and the second source/drain region, and the second source/drain region is arranged on the lower insulating layer.

8. The integrated circuit device of claim 7, further comprising:

a front wiring structure disposed on the plurality of gate structures; and an upper contact disposed on the second source/drain region and connected to the front wiring structure.

9. The integrated circuit device of claim 1, wherein the lower insulating layer has a dielectric constant of about 3.5 or higher.

10. An integrated circuit device comprising:

an insulating substrate including a plurality of fin structures extending in a first horizontal direction;

a lower insulating layer covering top surfaces of the plurality of fin structures;

a plurality of gate structures extending in a second horizontal direction crossing the first horizontal direction on the insulating substrate; and a first source/drain region and a second source/drain region spaced apart from each other in the first horizontal direction on the insulating substrate with a first gate structure of the plurality of gate structures disposed therebetween; and a semiconductor epitaxial structure disposed below a bottom surface of the lower insulating layer, wherein the first source/drain region penetrates the lower insulating layer and a portion of the semiconductor epitaxial structure, and contacts the semiconductor epitaxial structure;

wherein a bottom surface of the semiconductor epitaxial structure is placed at a lower vertical level than a bottom surface of the first source/drain region, and both the bottom surface of the semiconductor epitaxial structure and the bottom surface of the first source/drain region are placed at lower vertical levels than a bottom surface of the lower insulating layer.

11. The integrated circuit device of claim 10, wherein the second source/drain region is spaced apart from the insulating substrate in a vertical direction with the lower insulating layer disposed therebetween.

12. The integrated circuit device of claim 10, wherein a sidewall of the semiconductor epitaxial structure comprises a portion with a positive profile that extends to increase a width of the semiconductor epitaxial structure in the first horizontal direction as the sidewall of the semiconductor epitaxial structure moves away from a bottom surface of the lower insulating layer.

13. The integrated circuit device of claim 10, further comprising a plurality of nanosheet stacks disposed on the lower insulating layer and surrounded by the plurality of gate structures, wherein the first source/drain region comprises:

a body portion disposed between the plurality of nanosheet stacks; and a vertical extension portion passing through the lower insulating layer and at least partially passing through a corresponding one of the plurality of fin structures, and a width of the semiconductor epitaxial structure in the first horizontal direction is greater than a width of the vertical extension portion of the first source/drain region in the first horizontal direction.

14. The integrated circuit device of claim 13, wherein a width of the body portion of the first source/drain region in the second horizontal direction is greater than a width of the vertical extension portion of the first source/drain region in the second horizontal direction.

15. An integrated circuit device comprising:

a rear wiring structure extending in a first horizontal direction;

an insulating substrate disposed on the rear wiring structure and including a plurality of fin structures extending in the first horizontal direction;

a lower insulating layer covering the plurality of fin structures;

a plurality of gate structures extending in a second horizontal direction crossing the first horizontal direction on the insulating substrate;

a plurality of nanosheet stacks disposed on the lower insulating layer and at least partially surrounded by the plurality of gate structures;

a first source/drain region disposed on the insulating substrate and including a body portion and a vertical extension portion, wherein the body portion is disposed between the plurality of nanosheet stacks, and the vertical extension portion passes through the lower insulating layer and at least partially passes through a corresponding one of the plurality of fin structures;

a second source/drain region spaced apart from the first source/drain region in the first horizontal direction with a first gate structure of the plurality of gate structures disposed therebetween;

a semiconductor epitaxial structure at least partially surrounding the vertical extension portion of the first source/drain region; and a lower contact connecting the semiconductor epitaxial structure with the rear wiring structure;

wherein a sidewall of the semiconductor epitaxial structure comprises:

a first portion with a positive profile that extends to increase a width of the semiconductor epitaxial structure in the first horizontal direction as the sidewall of the semiconductor epitaxial structure moves away from a bottom surface of the lower insulating layer; and a second portion with a negative profile that extends to decrease the width of the semiconductor epitaxial structure in the first horizontal direction as the sidewall of the semiconductor epitaxial structure moves away from the bottom surface of the lower insulating layer.

16. The integrated circuit device of claim 15, wherein a width of the semiconductor epitaxial structure in the first horizontal direction is greater than a width of the vertical extension portion of the first source/drain region in the first horizontal direction, and a width of the semiconductor epitaxial structure in the second horizontal direction is greater than a width of the vertical extension portion of the first source/drain region in the second horizontal direction.

17. The integrated circuit device of claim 15, wherein the second source/drain region is spaced apart from the insulating substrate in a vertical direction with the lower insulating layer disposed between the second source/drain region and the insulating substrate.

* * * * *